(12) United States Patent
Lee et al.

(10) Patent No.: US 11,149,199 B2
(45) Date of Patent: Oct. 19, 2021

(54) QUANTUM DOTS, COMPOSITIONS AND COMPOSITES INCLUDING THE SAME, AND ELECTRONIC DEVICE INCLUDING THE SAME

(71) Applicant: Samsung Display Co., Ltd., Yongin-si (KR)

(72) Inventors: Jongmin Lee, Hwaseong-si (KR); Young Seok Park, Yongin-si (KR); Taek Hoon Kim, Hwaseong-si (KR); Shin Ae Jun, Seongnam-si (KR); Jin A Kim, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 5 days.

(21) Appl. No.: 16/691,889

(22) Filed: Nov. 22, 2019

(65) Prior Publication Data
US 2020/0165517 A1    May 28, 2020

(30) Foreign Application Priority Data
Nov. 23, 2018 (KR) .......................... 10-2018-0146748

(51) Int. Cl.
*C09K 11/88* (2006.01)
*C09K 11/02* (2006.01)
(Continued)

(52) U.S. Cl.
CPC .......... *C09K 11/883* (2013.01); *C09K 11/025* (2013.01); *H01L 31/035236* (2013.01);
(Continued)

(58) Field of Classification Search
CPC ............... C09K 11/883; C09K 11/025; H01L 31/035236; H01L 33/06; H01L 51/502; G03F 7/0043
See application file for complete search history.

(56) References Cited

U.S. PATENT DOCUMENTS 7,476,487 B2   1/2009 Park et al.
7,746,423 B2   6/2010 Im et al.
(Continued)

FOREIGN PATENT DOCUMENTS

KR           0841186 B1    6/2008
KR       20110140049 A    12/2011
(Continued)

OTHER PUBLICATIONS

Byeong Guk Jeong et al., "Colloidal Spherical Quantum Wells with Near-Unity Photoluminescence Quantum Yield and Suppressed Blinking," ACS NANO, Oct. 2, 2016, pp. 9297-9305, vol. 10.
(Continued)

*Primary Examiner* — William Coleman
(74) *Attorney, Agent, or Firm* — Cantor Colburn LLP

(57) ABSTRACT

A quantum dot including a seed including a first semiconductor nanocrystal including a first Group II-VI compound, a quantum well surrounding the seed, the quantum well including a second semiconductor nanocrystal including a Group IIIA metal except aluminum and a Group V element, and a shell disposed on the quantum well, the shell including a third semiconductor nanocrystal including a second Group II-VI compound, wherein the quantum dot does not include cadmium, an energy bandgap of the second semiconductor nanocrystal is smaller than an energy bandgap of the first semiconductor nanocrystal and an energy bandgap of the third semiconductor nanocrystal, and an ultraviolet-visible (UV-Vis) absorption spectrum curve of the quantum dot does not have an inflection point within a wavelength range of about 450 nanometers (nm) to about 600 nm, and a quantum dot composite and a device including the same.

28 Claims, 8 Drawing Sheets

(51) Int. Cl.
  *H01L 31/0352* (2006.01)
  *H01L 33/06* (2010.01)
  *H01L 51/50* (2006.01)
  *B82Y 20/00* (2011.01)
  *B82Y 30/00* (2011.01)

(52) U.S. Cl.
  CPC ............ *H01L 33/06* (2013.01); *H01L 51/502* (2013.01); *B82Y 20/00* (2013.01); *B82Y 30/00* (2013.01)

(56) References Cited

U.S. PATENT DOCUMENTS

| | | | |
|---|---|---|---|
| 7,867,557 | B2 | 1/2011 | Pickett et al. |
| 7,964,278 | B2 | 6/2011 | Banin et al. |
| 8,309,170 | B2* | 11/2012 | Jang .................. C30B 29/40 427/212 |
| 8,343,576 | B2 | 1/2013 | Banin et al. |
| 8,963,119 | B2* | 2/2015 | Jang ............ H01L 21/02409 257/13 |
| 9,196,682 | B2 | 11/2015 | Jang et al. |
| 9,698,311 | B2 | 7/2017 | Greco et al. |
| 9,926,643 | B2* | 3/2018 | Jang .................. C30B 29/605 |
| 10,126,587 | B2 | 11/2018 | Chung |
| 10,246,634 | B2 | 4/2019 | Yang et al. |
| 10,246,638 | B1* | 4/2019 | Koposov ............ C09K 11/7492 |
| 10,364,391 | B2* | 7/2019 | Jang .................. C09K 11/70 |
| 2005/0129947 | A1 | 6/2005 | Peng et al. |
| 2011/0108799 | A1 | 5/2011 | Pickett et al. |
| 2017/0052444 | A1 | 2/2017 | Park et al. |
| 2017/0058194 | A1 | 3/2017 | Jang et al. |
| 2017/0306227 | A1 | 10/2017 | Ippen et al. |
| 2017/0373232 | A1* | 12/2017 | Kan .................. C01G 9/08 |
| 2018/0105739 | A1 | 4/2018 | Kim et al. |
| 2018/0142149 | A1 | 5/2018 | Youn et al. |
| 2018/0179441 | A1 | 6/2018 | Park et al. |
| 2018/0186998 | A1 | 7/2018 | Ahn et al. |
| 2018/0216250 | A1 | 8/2018 | Jang et al. |
| 2018/0239245 | A1 | 8/2018 | Yang et al. |
| 2019/0011782 | A1 | 1/2019 | Pickett et al. |
| 2019/0072815 | A1 | 3/2019 | Chung |
| 2019/0257003 | A1* | 8/2019 | Kim .................. C30B 29/48 |
| 2020/0017765 | A1* | 1/2020 | Kim .................. H01L 27/322 |

FOREIGN PATENT DOCUMENTS

| | | |
|---|---|---|
| KR | 1320549 B1 | 10/2013 |
| KR | 1374512 B1 | 3/2014 |
| KR | 20140121351 A | 10/2014 |
| KR | 1508568 B1 | 4/2015 |
| KR | 20160120359 A | 10/2016 |
| KR | 1020170022951 A | 3/2017 |
| KR | 1020170034055 A | 3/2017 |
| KR | 1020170048220 A | 5/2017 |
| KR | 1020180043748 A | 4/2018 |
| KR | 1020180058208 A | 5/2018 |
| KR | 1020180077086 A | 7/2018 |
| KR | 1020180081002 A | 7/2018 |
| KR | 1020180096535 A | 8/2018 |
| WO | 2004066361 A2 | 8/2004 |
| WO | 2004066361 A3 | 11/2004 |
| WO | 2019008374 A1 | 1/2019 |

OTHER PUBLICATIONS

David A. Browne et al., "Electron transport in unipolar InGaN/GaN multiple quantum well structures grown by NH3 molecular beam epitaxy," Journal of Applied Physics, May 8, 2015, pp. 185703-1-185703-9, Vo. 117.

Nathalie Claes et al., "Characterization of Janus gold nanoparticles obtained via spontaneous binary polymer shell segregation," The 16th European Microscopy Congress 2016, DOI-10.1002/9783527808465.EMC2016.5982, pp. 690-691.

Wikipedia, Atom probe, pp. 1-10, https://en.wikipedia.org/wiki/Atom_probe, printed Nov. 4, 2019.

Yongsoo Yang et al., "Deciphering chemical order/disorder and material properties at the single-atom level," Nature, Letter, Feb. 2, 2017, pp. 75-92 , vol. 542.

A. M. Saeboe et al., "Pushing indium phosphide quantum dot emission deeper into the near infrared," Proc. of SPIE, 2018, (Feb. 23, 2018), pp. 1050715-1-1050715-9 vol. 10507, https://doi.org/10.1117/12.2295370.

Extended European Search Report dated Mar. 27, 2020, of the corresponding European Patent Application No. 19210980.9.

* cited by examiner

Pattern Preparation by using a photoresist

Repeating the Patterning Process three times

QUANTUM DOTS, COMPOSITIONS AND COMPOSITES INCLUDING THE SAME, AND ELECTRONIC DEVICE INCLUDING THE SAME

CROSS-REFERENCE TO RELATED APPLICATIONS

This application claims priority to and the benefit of Korean Patent Application No. 10-2018-0146748 filed in the Korean Intellectual Property Office on Nov. 23, 2018, and all the benefits accruing therefrom under 35 U.S.C. § 119, the content of which in its entirety is herein incorporated by reference.

BACKGROUND

1. Field

Quantum dots, compositions, and composites including the same, and an electronic device including the same are disclosed.

2. Description of the Related Art

Quantum dots (i.e., nano-sized semiconductor nanocrystals) may have different energy bandgaps by controlling sizes and compositions of nanocrystals, unlike bulk materials. Quantum dots may exhibit electroluminescence and photoluminescence properties. Photoluminescence properties of quantum dots may be applied in, e.g., used, various fields. In terms of environmental views, e.g., concerns, development of non-cadmium-based quantum dots capable of realizing, e.g., exhibiting, improved photoluminescence properties is desirable.

SUMMARY

An embodiment provides a composition including a non-cadmium-based quantum dot exhibiting improved photoluminescence properties (e.g., blue light absorption).

An embodiment provides a quantum dot-polymer composite including a non-cadmium-based quantum dot.

An embodiment provides a stack structure and an electronic device including the quantum dot-polymer composite.

An embodiment provides the aforementioned non-cadmium-based quantum dot.

In an embodiment, a quantum dot (or quantum dots) includes a seed including a first semiconductor nanocrystal including a first Group II-VI compound, a quantum well (e.g., quantum well layer) surrounding the seed, the quantum well including a second semiconductor nanocrystal including a Group IIIA metal and a Group V element, wherein the Group IIIA metal (or the second semiconductor nanocrystal) does not include aluminum, and a shell disposed on the quantum well, the shell including a third semiconductor nanocrystal including a second Group II-VI compound, and wherein the quantum dot does not include cadmium, wherein an energy bandgap of the second semiconductor nanocrystal is smaller than an energy bandgap of the first semiconductor nanocrystal, an energy bandgap of the second semiconductor nanocrystal is smaller than an energy bandgap of the third semiconductor nanocrystal, and an ultraviolet-visible (UV-Vis) absorption spectrum curve of the quantum dot does not have an inflection point within a wavelength range of about 450 nanometers (nm) to about 600 nm.

The first Group II-VI compound, the second Group II-VI compound, or a combination thereof may include zinc chalcogenide.

The first semiconductor nanocrystal and the third semiconductor nanocrystal may have different compositions from one another.

The first semiconductor nanocrystal and the third semiconductor nanocrystal may have the same composition with each other.

The first semiconductor nanocrystal may include ZnSe, ZnTeSe, ZnSeS, ZnS, or a combination thereof.

The third semiconductor nanocrystal may include ZnSe, ZnSeS, ZnS, or a combination thereof.

The quantum well may include indium and phosphorus.

The quantum well may further include zinc, aluminum, or a combination thereof.

The quantum well may further include aluminum and oxygen.

The quantum dot may have a total molar amount of indium and phosphorus of less than or equal to about 20%, based on a total number of moles of elements in the quantum dot (e.g., measured by an ICP analysis).

The quantum dot may have a ratio of phosphorus relative to indium of greater than or equal to about 1:1.

The quantum dot may have a ratio of zinc relative to indium of greater than or equal to about 20:1.

The seed may include zinc; and selenium, sulfur, or a combination thereof. The seed may further include tellurium.

The shell may include zinc, sulfur, and optionally, selenium.

The quantum well may include a plurality of layers and adjacent layers of the plurality of layers may have different compositions from one another.

A layer of the quantum well (e.g., directly) adjacent (or closer) to the seed may include zinc phosphide, zinc indium phosphide, aluminum-phosphorus-oxide, or a combination thereof.

A layer of the quantum well (e.g., directly) adjacent to (e.g., in contact with) the shell may include indium phosphide.

The quantum dot may emit green light, and a UV-Vis absorption spectrum curve of the quantum dot may not have an inflection point within a wavelength range of greater than or equal to about 450 nm and less than or equal to about 620 nm (or less than or equal to about 580 nm or less than or equal to about 540 nm).

In the UV-Vis absorption spectrum curve of the quantum dot, a ratio of an intensity at a wavelength of 450 nm relative to an intensity at a wavelength of 500 nm (e.g., at a given concentration (weight ratio)) may be greater than or equal to about 2.0:1.

In the UV-Vis absorption spectrum curve of the quantum dot, a ratio of an intensity at a wavelength of 450 nm relative to an intensity at a wavelength of 500 nm (e.g., at a given concentration (weight ratio)) may be greater than or equal to about 3.0:1.

In the UV-Vis absorption spectrum curve of the quantum dot, a ratio of an intensity at a wavelength of 450 nm relative to an intensity at a wavelength of 500 nm (e.g., at a given concentration (weight ratio)) may be greater than or equal to about 3.5:1.

The quantum dot may emit red light, and the UV-Vis absorption spectrum curve of the quantum dot may not have an inflection point within a wavelength range of 550 nm to 620 nm.

The UV-Vis absorption spectrum curve of the quantum dot may exhibit a ratio of an intensity at a wavelength of 450 nm (or 550 nm) relative to an intensity at a wavelength of 600 nm (e.g., at a given concentration (weight ratio)) of greater than or equal to about 2.0:1.

In an embodiment, a method of producing the aforementioned quantum dot includes obtaining the seed;

forming a buffer layer on the seed, the buffer layer including a zinc-containing Group II-V compound, a zinc-containing Group II-III-V compound, an aluminum phosphorus oxide, or a combination thereof, on the seed;

forming the quantum well on the buffer layer; and forming the shell on the quantum well.

The method may further include separating the seed from a reaction medium (for example, including an organic solvent) before forming the buffer layer.

The method may further include separating the seed from a reaction medium (for example, including an organic solvent) after forming the buffer layer and before forming the quantum well.

In an embodiment, a composition includes the aforementioned quantum dots, a dispersing agent, a polymerizable monomer including a carbon-carbon unsaturated bond, an initiator, and a solvent.

The dispersing agent may be a polymer including a carboxylic acid group.

The polymer including the carboxylic acid group may include a copolymer of a monomer combination including a first monomer including a carboxylic acid group and a carbon-carbon double bond, a second monomer including a carbon-carbon double bond and a hydrophobic moiety and not including a carboxylic acid group and optionally a third monomer including a carbon-carbon double bond and a hydrophilic moiety and not including a carboxylic acid group; a multiple aromatic ring-containing polymer having a backbone structure in which two aromatic rings are bound to a quaternary carbon atom that is a constituent atom of another cyclic moiety in a main chain of the backbone structure, the multiple aromatic ring-containing polymer including a carboxylic acid group (—COOH); or a combination thereof.

The composition may further include a multiple thiol compound including at least two thiol groups at a terminal end of the multiple thiol compound, a metal oxide particulate, or a combination thereof.

In an embodiment, a patterned film includes at least one repeating section configured to emit light in a predetermined wavelength range, wherein the repeating section includes a quantum dot polymer composite and the quantum dot-polymer composite includes a polymer matrix; and the aforementioned quantum dot(s) is (e.g., are dispersed) in the polymer matrix.

The polymer matrix may include a dispersing agent, a polymerization product of a polymerizable monomer including a carbon-carbon double bond, and optionally a polymerization product of the polymerizable monomer and a multiple thiol compound including at least two thiol groups at a terminal end of the multiple thiol compound.

The repeating section may include a first section configured to emit red light.

The repeating section may include a second section configured to emit green light.

The repeating section may include a first section configured to emit red light and a second section configured to emit green light.

In an embodiment, a display device includes a light source and a photoluminescence element, wherein the photoluminescence element includes a substrate and the aforementioned patterned film disposed on a surface of the substrate, and the light source is configured to provide the photoluminescence element with incident light.

The incident light may have a photoluminescence peak wavelength in a range of about 440 nm to about 460 nm.

An embodiment provides an electronic device including the aforementioned quantum dots.

The electronic device may be an electroluminescent device, an organic light emitting diode (OLED), a sensor, an imaging sensor, a solar cell, or a liquid crystal display (LCD) device.

The quantum dots according to an embodiment may exhibit improved photoluminescence properties (e.g., improved blue light absorption). The quantum dots may be used in various display devices and biological labelling (e.g., bio sensor, bio imaging, etc.), a photo detector, a solar cell, a hybrid composite, and the like.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
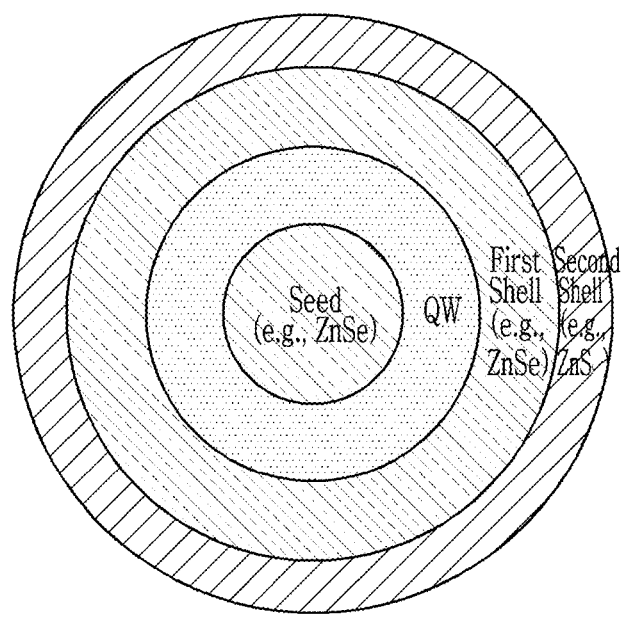
FIG. 1 is a schematic view showing a cross-section of a quantum dot according to an embodiment.
Figure 1:
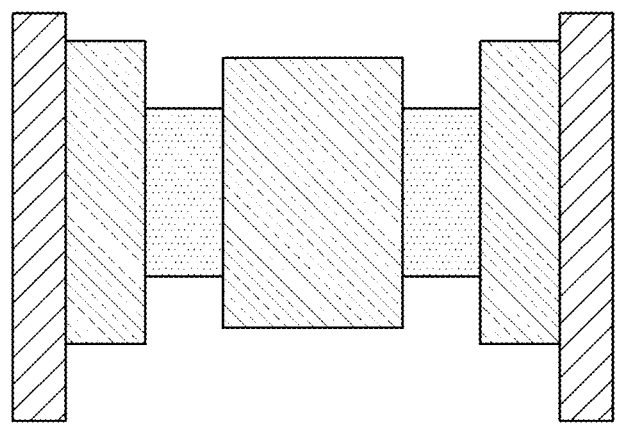

Advantages and characteristics of this disclosure, and a method for achieving the same, will become evident referring to the following example embodiments together with the drawings attached hereto. However, the embodiments should not be construed as being limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising," will be understood to imply the inclusion of stated elements but not the exclusion of any other elements.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

Further, the singular includes the plural unless mentioned otherwise. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, "substituted" refers to replacement of hydrogen of a compound by a substituent selected from a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, halogen (—F, —Cl, —Br or —I), a hydroxy group (—OH), a nitro group (—NO$_2$), a cyano group (—CN), an amino group (—NRR' wherein R and R' are each independently hydrogen or a C1 to C6 alkyl group), an azido group (—N$_3$), an amidino group (—O(=NH)NH$_2$), a hydrazino group (—NHNH$_2$), a hydrazono group (=N(NH$_2$)), an aldehyde group (—O(=O)H), a carbamoyl group (—C(O)NH$_2$), a thiol group (—SH), an ester group (—O(=O)OR, wherein R is a C1 to C6 alkyl group or a C6 to C12 aryl group), a carboxyl group (—COOH) or a salt thereof (—O(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), and a combination thereof.

As used herein, when a definition is not otherwise provided, "monovalent organic functional group" refers to a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, or a C2 to C30 heterocycloalkyl group.

As used herein, when a definition is not otherwise provided, "hetero" refers to inclusion of at least one to three heteroatoms selected from N, O, S, Si, and P.

As used herein, when a definition is not otherwise provided, "alkylene group" refers to a straight or branched saturated aliphatic hydrocarbon group having at least two valences and optionally substituted with at least one substituent. As used herein, "arylene group" refers to a functional group having at least two valences obtained by removal of at least two hydrogens in at least one aromatic ring, and optionally substituted with at least one substituent.

As used herein, when a definition is not otherwise provided, "aliphatic" refers to a C1 to C30 linear or branched alkyl group, a C2 to C30 linear or branched alkenyl group, or a C2 to C30 linear or branched alkynyl group.

As used herein, when a definition is not otherwise provided, "aromatic" refers to a C6 to C30 aryl group or a C2 to C30 heteroaryl group.

As used herein, when a definition is not otherwise provided, "alicyclic" refers to a C3 to C30 cycloalkyl group, a C3 to C30 cycloalkenyl group, or a C3 to C30 cycloalkynyl group.

As used herein, when a definition is not otherwise provided, "(meth)acrylate" refers to acrylate, methacrylate, or a combination thereof. The (meth)acrylate may include a (C1 to C10 alkyl)acrylate, a (C1 to C10 alkyl)methacrylate, or a combination thereof.

As used herein, when a definition is not otherwise provided, "alkoxy" refers to alkyl group that is linked via an oxygen (i.e., alkyl-O—), for example methoxy, ethoxy, and sec-butyloxy groups.

As used herein, when a definition is not otherwise provided, "alkyl" refers to a straight or branched chain, saturated, monovalent hydrocarbon group (e.g., methyl or hexyl).

As used herein, when a definition is not otherwise provided, "alkynyl" refers to a straight or branched chain, monovalent hydrocarbon group having at least one carbon-carbon triple bond (e.g., ethynyl).

As used herein, when a definition is not otherwise provided, "amine" refers to a group having the general formula —NRR, wherein each R is independently hydrogen, a C1-C12 alkyl group, a C7-C20 alkylaryl group, a C7-C20 arylalkyl group, or a C6-C18 aryl group.

As used herein, when a definition is not otherwise provided, "arene" refers to a hydrocarbon having an aromatic ring, and includes monocyclic and polycyclic hydrocarbons wherein the additional ring(s) of the polycyclic hydrocarbon may be aromatic or nonaromatic. Specific arenes include benzene, naphthalene, toluene, and xylene.

As used herein, when a definition is not otherwise provided, "aryl" refers to a monovalent group formed by the removal of one hydrogen atom from one or more rings of an arene (e.g., phenyl or naphthyl).

As used herein, when a definition is not otherwise provided, "arylalkyl" refers to a substituted or unsubstituted aryl group covalently linked to an alkyl group that is linked to a compound (e.g., a benzyl is a C7 arylalkyl group).

As used herein, when a definition is not otherwise provided, "cycloalkenyl" refers to a monovalent group having one or more rings and one or more carbon-carbon double bond in the ring, wherein all ring members are carbon (e.g., cyclopentyl and cyclohexyl).

As used herein, when a definition is not otherwise provided, "cycloalkyl" refers to a monovalent group having one or more saturated rings in which all ring members are carbon (e.g., cyclopentyl and cyclohexyl).

As used herein, when a definition is not otherwise provided, "cycloalkynyl" refers to a stable aliphatic monocyclic or polycyclic group having at least one carbon-carbon triple bond, wherein all ring members are carbon (e.g., cyclohexynyl).

As used herein, when a definition is not otherwise provided, "ester" refers to a group of the formula —O(C=O)Rx or a group of the formula —(C=O)ORx wherein Rx is C1 to C28 aromatic organic group or aliphatic organic group. An ester group includes a C2 to C30 ester group, and specifically a C2 to C18 ester group.

As used herein, when a definition is not otherwise provided, "heteroalkyl" refers to alkyl group that comprises at least one heteroatom covalently bonded to one or more carbon atoms of the alkyl group. Each heteroatom is independently chosen from nitrogen (N), oxygen (O), sulfur (S), and or phosphorus (P).

As used herein, when a definition is not otherwise provided, "ketone" refers to a C2 to C30 ketone group, and specifically a C2 to C18 ketone group. Ketone groups have the indicated number of carbon atoms, with the carbon of the keto group being included in the numbered carbon atoms. For example a C2 ketone group is an acetyl group having the formula $CH_3(C=O)$—.

In an embodiment, a "hydrophobic moiety" may be a moiety providing the corresponding compound with a tendency to be agglomerated in an aqueous solution and to repel water. In an embodiment, the hydrophobic moiety may include an aliphatic hydrocarbon group having a carbon number of 2 or greater (alkyl, alkenyl, alkynyl, etc.), an aromatic hydrocarbon group having a carbon number of 6 or greater (phenyl, naphthyl, aralkyl group, etc.), or an alicyclic hydrocarbon group having a carbon number of 5 or greater (cyclohexyl, norbornene, norbornane, tricyclodecane, etc.). In an embodiment, the hydrophobic moiety may substantially lack of capability of making a hydrogen bond with the ambient medium, may have a polarity thereof that is not matched with that of the ambient medium.

As used herein, "dispersion" refers to dispersion wherein a dispersed phase is a solid and a continuous phase includes a liquid. For example, "dispersion" may refer to a colloidal dispersion wherein the dispersed phase has a dimension of greater than or equal to about 1 nm, for example, greater than or equal to about 2 nm, greater than or equal to about 3 nm, or greater than or equal to about 4 nm and several micrometers (μm) or less (e.g., about 2 μm or less or about 1 μm or less).

As used herein, "group" refers to a group of Periodic Table.

As used herein, "Group I" refers to Group IA and Group IB, and examples may include Li, Na, K, Rb, and Cs, but are not limited thereto.

As used herein, "Group II" refers to Group IIA and Group IIB, and examples of Group II metal may be Cd, Zn, Hg, and Mg, but are not limited thereto.

As used herein, "Group III" refers to Group IIIA and Group IIIB, and examples of Group III metal may be Al, In, Ga, and TI but are not limited thereto.

As used herein, "Group IV" refers to Group IVA and Group IVB, and examples of a Group IV metal may be Si, Ge, and Sn, but are not limited thereto.

As used herein, "metal" may include a semi-metal such as Si.

As used herein, "Group V" refers to Group VA, and examples may include nitrogen, phosphorus, arsenic, antimony, and bismuth, but are not limited thereto.

As used herein, "Group VI" refers to Group VIA, and examples may include sulfur, selenium, and tellurium, but are not limited thereto.

A UV-vis absorption spectrum curve and a photoluminescent spectrum curve may be obtained from an analysis using a UV-Vis spectrophotometer and a fluorescent spectrophotometer, which are commercially available.

A semiconductor nanocrystal particle also known as a (e.g., colloidal) quantum dot is a crystalline material having a size of several nanometers and may have a large surface area per a unit volume and may exhibit a quantum confinement effect. Quantum dots may absorb light from an excitation source to be excited, and may emit energy corresponding to its energy bandgap.

Quantum dots have potential applicability to, e.g., in, various electronic devices due to unique photoluminescence characteristics of the quantum dots. Quantum dots having properties that may be applicable to, e.g., used in, electronic devices and the like are may be cadmium-based quantum dots. However, cadmium may cause environment/health problems and thus is a restricted element. Cadmium-free quantum dots (hereinafter, also referred to as non-cadmium quantum dots) may be, e.g., include, for example a Group III-V-based nanocrystal. Non-cadmium quantum dots may have inferior photoluminescence properties (e.g., blue light absorption) and stability compared with cadmium-based quantum dots. Blue light may be used as an energy excitation source (e.g., having a wavelength of about 450 nm) for the quantum dot. Cadmium-based quantum dots may have high absorption intensity for blue light but in the case of non-cadmium-based quantum dots, an absorption intensity at, e.g., of, blue light (e.g., wavelength of about 450 nm) may not be high, and a display device including non-cadmium-based quantum dots may exhibit reduced luminance.

In an LCD device, polarized light from a liquid crystal layer passes (through) an absorption type color filter and expresses a color and thus the liquid crystal display (LCD) device may have problems of a narrow viewing angle as well as a deteriorated luminance due to a low light transmittance of the absorption type color filter. A photoluminescent type color filter may be an alternative to overcome technical limits of the LCD display device including the absorption type color filter. A quantum dot-based color filter may use blue light instead of white light as an excitation light, and a color filter may be disposed in front of the device to convert the excitation light to the desirable light (e.g., green light/red light). Therefore, a quantum dot-based color filter may reduce, e.g., minimize or solve, technical problems of, for example, a liquid crystal display (e.g., narrow viewing angle and light loss). Light with linearity (passing through the liquid crystal layer and going straight) may be scattered in all directions, and this may reduce, e.g., minimize or solve, a viewing angle problem. The optical loss that may occur by using the absorption type color filter may also be reduced or minimized.

However, when employing a quantum dot-based color filter, the excitation light propagating in the forward direction of the device (e.g., in a red or green light emitting section) may become a technical problem and it may be desirable to block the excitation light propagating in the forward direction of the device. Non-cadmium-based quantum dot may not provide enough absorption to block excitation light propagating in the forward direction of the device. The introduction of light scatterers may improve absorption. However, light scatterers may increase manufacturing cost. A light scatterer may have a high external light reflectance, which may cause an increase in external light reflection, and an increased solid content caused by a light scatterer may provide additional difficulties in the process. In order to block the excitation light, a blue cut filter may be used, which may cause an additional cost and the increase of the external light reflection, and may lead to optical loss, contrast deterioration, and an image sharpness reduction of the display device.

The quantum dot(s) according to an embodiment may exhibit increased blue light absorption (or blue light absorption rate) while not including cadmium due to the following structure, and the above problems may be reduced, e.g., minimized or solved. In case of the quantum dot according to an embodiment, such an increased excitation light absorption may contribute to suppressing blue light leakage at, e.g., with, a reduced amount, e.g., number, of light scatterers, without using a blue cut filter, or a combination thereof.

In an embodiment, a quantum dot (or quantum dots) may include a seed including a first semiconductor nanocrystal including a Group II-VI compound, e.g., a first Group II-VI compound, a quantum well surrounding the seed and including a second semiconductor nanocrystal including a Group IIIA metal except aluminum and a Group V element, and a shell disposed on the quantum well and including a third semiconductor nanocrystal including a Group II-VI compound, e.g., a third Group II-VI compound. The quantum dot according to an embodiment does not include cadmium. In an embodiment, the first Group II-VI compound and the third Group II-VI compound may have different compositions from one another. In an embodiment, the first Group II-VI compound and the third Group II-VI compound may have a same composition.

An energy bandgap of the second semiconductor nanocrystal may be smaller than an energy bandgap of the first semiconductor nanocrystal and an energy bandgap of the third semiconductor nanocrystal. For example, referring to FIG. 1, in an energy band alignment, a valence band edge and a conduction band edge of the second semiconductor nanocrystal may be within the bandgap of the first semiconductor nanocrystal. The valence band edge and the conduction band edge of the second semiconductor nanocrystal may be within the bandgap of the third semiconductor nanocrystal. An energy bandgap is known for a bulk material (e.g., ZnSe, InP, ZnS, ZnSeS, or the like) or may be calculated therefrom.

The Group II-VI compound included in the first semiconductor nanocrystal and the Group II-VI compound included in the third semiconductor nanocrystal may include a zinc chalcogenide. In an embodiment, the first semiconductor nanocrystal and the third semiconductor nanocrystal may have different compositions from one another. In an embodiment, the first semiconductor nanocrystal and the third semiconductor nanocrystal may have the same composition.

The energy bandgap of the first semiconductor nanocrystal and the energy bandgap of the third semiconductor nanocrystal may be the same or different. In an embodiment, the energy bandgap of the first semiconductor nanocrystal may be greater than the energy bandgap of the third semiconductor nanocrystal. In an embodiment, the energy bandgap of the first semiconductor nanocrystal may be smaller than the energy bandgap of the third semiconductor nanocrystal.

The zinc chalcogenide is a compound including a zinc metal and a chalcogen element (e.g., selenium, tellurium, sulfur, or a combination thereof). The zinc chalcogenide may include ZnSe, ZnTeSe, ZnSeS, ZnS, ZnSTe, or a combination thereof.

The first semiconductor nanocrystal may include ZnSe, ZnTeSe, ZnSeS, ZnS, or a combination thereof. The third semiconductor nanocrystal may include ZnSe, ZnSeS, ZnS, or a combination thereof. In an embodiment, the seed may include zinc and selenium, sulfur, or a combination thereof. In an embodiment, the seed does not include sulfur. In an embodiment, the seed does not include selenium. The seed may include zinc, selenium, and sulfur. The seed may include tellurium as desired.

In an embodiment, the shell may include zinc and sulfur. The shell may further include selenium.

The seed may include zinc and selenium and the shell may include zinc, selenium, and sulfur.

In an embodiment, the quantum well (QW) may include indium and phosphorus. The quantum well may include indium phosphide. The quantum well may further include a heterogeneous element. The heterogeneous element may include zinc, aluminum, or a combination thereof. The heterogeneous element may further include aluminum, oxygen, or a combination thereof. The quantum dot according to an embodiment may have a structure in which the heterogeneous element is disposed on an interface between the seed and the quantum well.

The quantum well may include a plurality of layers, and adjacent layers of the plurality of layers may have different compositions. Among the plurality of layers, the layer adjacent to the seed (hereinafter also referred to as a buffer layer) may include zinc phosphide, zinc indium phosphide, aluminum-phosphorus-oxide, or a combination thereof. Without being bound by any particular theory, the presence of the buffer layer, the composition ratio described below, or a combination thereof may contribute the absence of an inflection point in an ultraviolet-visible (UV-vis) absorption spectrum of the quantum dots. The quantum dot of the embodiment may exhibit a significantly improved blue light absorption (rate).

Among the plurality of layers of the quantum well, the layer adjacent to the shell (e.g., the layer disposed directly on the buffer layer) may include indium phosphide. In an embodiment, among the plurality of layers, the layer adjacent to the shell may not include zinc. In an embodiment, the layer adjacent to the shell may not include aluminum. In an embodiment, the layer adjacent to the shell does not include oxygen. In an embodiment, the layer adjacent to the shell of the plurality of layers may not include at least one or all of the aforementioned heterogeneous elements.

In an embodiment, the shell (hereinafter, also referred to as semiconductor nanocrystal shell) has a gradient composition varying in a radial direction from the core. In the semiconductor nanocrystal shell, an amount (e.g., a concentration) of sulfur may increase toward a surface of the quantum dots.

The semiconductor nanocrystal shell may include at least two layers and adjacent layers may have a different composition. In an embodiment, the semiconductor nanocrystal shell may include a first layer disposed directly on the core and at least one outer layer (e.g., a second layer, a third layer, etc.) disposed on the first layer. The first layer may include a semiconductor nanocrystal and the outer layer (e.g., the second layer or the third layer) may include a semiconductor nanocrystal having a different composition from the semiconductor nanocrystal included in the first layer.

The semiconductor nanocrystal included in the first layer may include zinc, selenium, and optionally sulfur. In an embodiment, the semiconductor nanocrystal included in the first layer may include ZnSe, ZnSeS, or a combination thereof. The semiconductor nanocrystal of the outer layer may include zinc and sulfur, and optionally a selenium. In an embodiment, the semiconductor nanocrystal of the outer layer may include ZnSeS, ZnS, or a combination thereof.

An outermost layer of the quantum dot may include a semiconductor nanocrystal consisting of zinc and sulfur.

In the quantum dot according to an embodiment, a total molar amount of the Group IIIA metal (e.g., indium) and the Group V element (e.g., phosphorus) may be less than about 20%, for example, less than or equal to about 19%, less than or equal to about 18%, less than or equal to about 17%, less than or equal to about 16%, less than or equal to about 15%, less than or equal to about 14%, less than or equal to about 13%, less than or equal to about 12%, less than or equal to about 11%, less than or equal to about 10%, less than or equal to about 9%, less than or equal to about 8%, less than or equal to about 7%, less than or equal to about 6%, less than or equal to about 5%, or less than or equal to about 4%, based on a total molar amount of elements included in the quantum dot. A total molar amount of indium and phosphorus may be greater than or equal to about 0.05%, greater than or equal to about 0.1%, greater than or equal to about 0.2%, greater than or equal to about 0.3%, greater than or equal to about 0.4%, greater than or equal to about 0.5%, greater than or equal to about 0.6%, greater than or equal to about 0.7%, greater than or equal to about 0.8%, greater than or equal to about 0.9%, or greater than or equal to about 1%, based on a total molar amount of elements included in the quantum dot.

Hereinafter, the composition of the quantum dot will be explained with indium as an example of a Group IIIA metal except for aluminum, phosphorus as an example of a Group V element, zinc as an example of a Group II metal included in a Group II-VI compound, and selenium as an example of a VI element, but is not limited thereto. As used herein, a ratio (e.g., having a relation with the composition of the quantum dot) means a molar ratio unless otherwise indicated.

In the quantum dot, a molar ratio of a Group V element (e.g., phosphorus) relative to a Group IIIA metal (e.g., indium) may be greater than or equal to about 1:1, for example, greater than or equal to about 1.01:1, greater than or equal to about 1.02:1, greater than or equal to about 1.03:1, greater than or equal to about 1.04:1, greater than or equal to about 1.05:1, greater than or equal to about 1.06:1, greater than or equal to about 1.07:1, greater than or equal to about 1.08:1, greater than or equal to about 1.09:1, greater than or equal to about 1.1:1, greater than or equal to about 1.11:1, greater than or equal to about 1.12:1, or greater than or equal to about 1.13:1. In the quantum dot, a mole ratio of a Group V element (e.g., phosphorus) relative to a Group 3A metal (e.g., indium) may be less than about 2:1, for example, less than or equal to about 1.9:1, less than or equal to about 1.8:1, less than or equal to about 1.7:1, less than or equal to about 1.6:1, less than or equal to about 1.5:1, less than or equal to about 1.4:1, less than or equal to about 1.3:1, less than or equal to about 1.29:1, less than or equal to about 1.28:1, less than or equal to about 1.27:1, less than or equal to about 1.26:1, less than or equal to about 1.25:1, less than or equal to about 1.24:1, less than or equal to about 1.23:1, less than or equal to about 1.22:1, less than or equal to about 1.21:1, less than or equal to about 1.2:1, less than or equal to about 1.19:1, less than or equal to about 1.18:1, less than or equal to about 1.17:1, less than or equal to about 1.16:1, or less than or equal to about 1.15:1.

In the quantum dot according to an embodiment, a ratio of a Group II metal (e.g., zinc) relative to indium may be greater than or equal to about 20, for example, greater than or equal to about 25:1, greater than or equal to about 30:1, greater than or equal to about 35:1, greater than or equal to about 36:1, greater than or equal to about 37:1, greater than or equal to about 38:1, greater than or equal to about 39:1, or greater than or equal to about 40:1. In the quantum dot, a ratio of zinc relative to indium may be less than or equal to about 100:1, less than or equal to about 99:1, less than or equal to about 98:1, less than or equal to about 97:1, less than or equal to about 96:1, less than or equal to about 95:1, less than or equal to about 94:1, less than or equal to about 93:1, less than or equal to about 92:1, less than or equal to about 91:1, less than or equal to about 90:1, less than or equal to about 89:1, less than or equal to about 88:1, less than or equal to about 87:1, less than or equal to about 86:1, less than or equal to about 85:1, less than or equal to about 84:1, less than or equal to about 83:1, less than or equal to about 82:1, less than or equal to about 81:1, less than or equal to about 80:1, less than or equal to about 79:1, less than or equal to about 78:1, less than or equal to about 77:1, or less than or equal to about 76:1.

In the quantum dot, a ratio of selenium relative to indium may be greater than or equal to about 1:1, greater than or equal to about 2:1, greater than or equal to about 3:1, greater than or equal to about 4:1, greater than or equal to about 5:1, greater than or equal to about 10:1, greater than or equal to about 15:1, greater than or equal to about 20:1, greater than or equal to about 25:1, greater than or equal to about 30:1, greater than or equal to about 35:1, greater than or equal to about 40:1, greater than or equal to about 45:1, or greater than or equal to about 50:1. In the quantum dot, a ratio of selenium relative to indium may be less than or equal to about 100:1, less than or equal to about 99:1, less than or equal to about 98:1, less than or equal to about 97:1, less than or equal to about 96:1, less than or equal to about 95:1, less than or equal to about 94:1, less than or equal to about 93:1, less than or equal to about 92:1, less than or equal to about 91:1, less than or equal to about 90:1, less than or equal to about 89:1, less than or equal to about 88:1, less than or equal to about 87:1, less than or equal to about 86:1, less than or equal to about 85:1, less than or equal to about 84:1, less than or equal to about 83:1, less than or equal to about 82:1, less than or equal to about 81:1, less than or equal to about 80:1, less than or equal to about 79:1, less than or equal to about 78:1, less than or equal to about 77:1, less than or equal to about 76:1, less than or equal to about 75:1, less than or equal to about 74:1, less than or equal to about 73:1, less than or equal to about 72:1, less than or equal to about 71:1, less than or equal to about 69:1, less than or equal to about 68:1, less than or equal to about 67:1, less than or equal to about 66:1, less than or equal to about 65:1, less than or equal to about 64:1 less than or equal to about 63:1, less than or equal to about 62:1, less than or equal to about 61:1, less than or equal to about 60:1, less than or equal to about 59:1, less than or equal to about 58:1, less than or equal to about 57:1, less than or equal to about 56:1, less than or equal to about 55:1, less than or equal to about 54:1, less than or equal to about 53:1, or less than or equal to about 52:1.

In the quantum dot, a ratio of zinc relative to selenium may be less than or equal to about 10:1, less than or equal to about 9:1, less than or equal to about 8:1, or less than or equal to about 7:1. In the quantum dot, a ratio of zinc relative to selenium may be greater than or equal to about 0.5:1, greater than or equal to about 0.6:1, greater than or equal to about 0.7:1, greater than or equal to about 0.8:1, greater than or equal to about 0.9:1, greater than or equal to about 1:1, greater than or equal to about 1.1:1, greater than or equal to about 1.2:1, greater than or equal to about 1.3:1, or greater than or equal to about 1.4:1.

In the quantum dot, a ratio of indium relative to selenium (or phosphorus relative to selenium) may be less than or equal to about 0.9:1, less than or equal to about 0.8:1, less than or equal to about 0.7:1, less than or equal to about 0.6:1, less than or equal to about 0.5:1, less than or equal to about 0.4:1, less than or equal to about 0.3:1, less than or equal to about 0.2:1, less than or equal to about 0.1:1, less than or equal to about 0.09:1, less than or equal to about 0.08:1, less than or equal to about 0.07:1, less than or equal to about 0.06:1, or less than or equal to about 0.05:1 and greater than or equal to about 0.001:1, greater than or equal to about 0.003:1, greater than or equal to about 0.006:1, greater than or equal to about 0.009:1, greater than or equal to about 0.01:1, or greater than or equal to about 0.015:1.

In the quantum dot, a ratio between a Group VI element (e.g., selenium, hereinafter also referred to as first Group VI element) and a Group VI element (e.g., also referred to as second group VI element) in the seed (or seed and shell) may be appropriately selected. In the quantum dot, a ratio of sulfur relative to selenium may be less than or equal to about 10:1, less than or equal to about 9:1, less than or equal to about 8:1, less than or equal to about 7:1, less than or equal to about 6:1, less than or equal to about 5:1, less than or equal to about 4:1, less than or equal to about 3:1, less than or equal to about 2:1, less than or equal to about 1:1, less than or equal to about 0.9:1, less than or equal to about 0.8:1, less than or equal to about 0.7:1, less than or equal to about 0.6:1, less than or equal to about 0.5:1, less than or equal to about 0.4:1, or less than or equal to about 0.3:1 and greater than or equal to about 0.001:1, greater than or equal to about 0.002:1, greater than or equal to about 0.003:1, greater than or equal to about 0.004:1, greater than or equal to about 0.005:1, greater than or equal to about 0.006:1, greater than or equal to about 0.007:1, greater than or equal to about 0.008:1, greater than or equal to about 0.009:1, greater than or equal to about 0.01:1, greater than or equal to about 0.02:1, greater than or equal to about 0.03:1, greater than or equal to about 0.04:1, greater than or equal to about 0.05:1, greater than or equal to about 0.06:1, greater than or equal to about 0.07:1, greater than or equal to about 0.08:1, greater than or equal to about 0.09:1, greater than or equal to about 0.1:1, greater than or equal to about 0.15:1, or greater than or equal to about 0.2:1.

In an embodiment, the seed may include zinc and selenium and the shell may include zinc, selenium, and sulfur.

The quantum dot may have a mole ratio of zinc relative to a sum of the selenium and sulfur (Zn/(S+Se)) of greater than or equal to about 1. In the quantum dot, the (Zn/(S+Se)) may be greater than or equal to about 1.05, greater than or equal to about 1.1, greater than or equal to about 1.11, greater than or equal to about 1.12, greater than or equal to about 1.13, greater than or equal to about 1.14, greater than or equal to about 1.15. The Zn/(S+Se) may be less than or equal to about 1.5, less than or equal to about 1.4, less than or equal to about 1.3, or less than or equal to about 1.2.

A size (e.g., a diameter) of the seed(s) and a thickness of the quantum well(s) may be controlled by taking into consideration a desired emission wavelength and a composition of the quantum dot. In the quantum dot of an embodiment, the size (e.g., an average size) (e.g., the diameter) of the seed may be greater than or equal to about 1 nm, greater than or equal to about 1.1 nm, greater than or equal to about 1.2 nm, greater than or equal to about 1.3 nm, greater than or equal to about 1.4 nm, greater than or equal to about 1.5 nm, greater than or equal to about 1.6 nm, greater than or equal to about 1.7 nm, greater than or equal to about 1.8 nm, greater than or equal to about 1.9 nm, greater than or equal to about 2 nm, greater than or equal to about 2.1 nm, greater than or equal to about 2.2 nm, greater than or equal to about 2.3 nm, greater than or equal to about 2.4 nm, greater than or equal to about 2.5 nm, greater than or equal to about 2.6 nm, greater than or equal to about 2.7 nm, greater than or equal to about 2.8 nm, greater than or equal to about 2.9 nm, or greater than or equal to about 3.0 nm. The diameter of the seed may be less than or equal to about 4 nm, less than or equal to about 3.5 nm, less than about 3.5 nm, less than or equal to about 3.4 nm, less than or equal to about 3.3 nm, less than or equal to about 3.2 nm, less than or equal to about 3.1 nm, less than or equal to about 3 nm, less than or equal to about 2.9 nm, or less than or equal to about 2.8 nm.

The thickness of the quantum well may be greater than or equal to about 0.2 nm, for example, greater than or equal to about 0.3 nm, or greater than or equal to about 0.4 nm. The thickness of the quantum well may be less than or equal to about 1.5 nm, for example, less than or equal to about 1.4 nm, less than or equal to about 1.35 nm, less than or equal to about 1.33 nm, less than or equal to about 1.32 nm, less than or equal to about 1.31 nm, less than or equal to about 1.3 nm, less than or equal to about 1.2 nm, less than or equal to about 1.1 nm, less than or equal to about 1.0 nm, less than or equal to about 0.9 nm, less than or equal to about 0.8 nm, less than or equal to about 0.7 nm, or less than or equal to about 0.6 nm.

The thickness of the shell may be greater than or equal to about 0.5 nm, greater than or equal to about 0.6 nm, greater than or equal to about 0.7 nm, greater than or equal to about 0.8 nm, greater than or equal to about 0.9 nm, greater than or equal to about 1 nm, greater than or equal to about 1.1 nm, greater than or equal to about 1.2 nm, greater than or equal to about 1.3 nm, greater than or equal to about 1.4 nm, or greater than or equal to about 1.5 nm and less than or equal to about 4 nm, less than or equal to about 3.5 nm, less than or equal to about 3.0 nm, less than or equal to about 2.9 nm, less than or equal to about 2.8, less than or equal to about 2.7 nm, less than or equal to about 2.6 nm, less than or equal to about 2.4 nm, less than or equal to about 2.3 nm, less than or equal to about 2.2 nm, less than or equal to about 2.1 nm, or less than or equal to about 2.0 nm.

The quantum dot according to an embodiment may have an improved size distribution by having the aforementioned composition and structure. A population including the quantum dot may have a standard deviation of less than or equal to about 10%, for example, less than about 10%, less than or equal to about 9%, less than or equal to about 8%, or less than or equal to about 7% of the average value.

In the quantum dot according to an embodiment, a UV-Vis absorption spectrum curve of the quantum dot does not have an inflection point in a wavelength range of greater than or equal to about 450 nm, greater than or equal to about 500 nm, greater than or equal to about 510 nm, greater than or equal to about 520 nm, greater than or equal to about 530 nm, greater than or equal to about 540 nm, greater than or equal to about 550 nm, greater than or equal to about 560 nm, or greater than or equal to about 570 nm and less than or equal to about 650 nm, less than or equal to about 640 nm, less than or equal to about 630 nm, less than or equal to about 620 nm, less than or equal to about less than or equal to about 600 nm, 590 nm, less than or equal to about 580 nm, less than or equal to about 570 nm, less than or equal to about 560 nm, less than or equal to about 550 nm, less than or equal to about 540 nm, or less than or equal to about 530 nm. In an embodiment, the UV-Vis absorption spectrum curve of the quantum dot may not have a first absorption peak.

Here, the inflection point is a point on a curve at which the concavity changes. For example, the inflection point may be a point on a continuously differentiable plane curve at which the curve crosses its tangent. For example, the curve may exhibit a change from concave downward to convex concave upward, or vice versa.

The quantum dot may emit red light. The quantum dot may emit green light. The red light may have a maximum photoluminescence peak wavelength of greater than or equal to about 600 nm, for example, greater than or equal to about 610 nm, or greater than or equal to about 620 nm, and less than or equal to about 650 nm, for example, less than or equal to about 640 nm, or less than or equal to about 635 nm. The green light may have a maximum photoluminescence peak wavelength of greater than or equal to about 500 nm, for example, greater than or equal to about 510 nm, greater than or equal to about 520 nm, greater than or equal to about 530 nm, or greater than or equal to about 540 nm and less than or equal to about 580 nm, for example, less than or equal to about 570 nm, less than or equal to about 560 nm, less than or equal to about 550 nm, less than or equal to about 540 nm, or less than or equal to about 535 nm.

The quantum dot may emit green light and a UV-Vis absorption spectrum curve of the quantum dot may not have an inflection point within the wavelength range of about 450 nm to about 540 nm or about 500 nm to about 600 nm. The quantum dot may exhibit increased blue light absorption. In the UV-Vis absorption spectrum curve of the quantum dot according to an embodiment, a ratio of an intensity at a wavelength of 450 nm relative to an intensity at a wavelength of 500 nm at the same concentration (weight ratio) may be greater than or equal to about 2.0:1, greater than or equal to about 2.5:1, greater than or equal to about 3:1, or greater than or equal to about 3.5:1.

The quantum dot may emit red light and a UV-Vis absorption spectrum curve of the quantum dot may not have an inflection point within the wavelength range of about 550 nm to about 650 nm or about 580 nm to about 620 nm. The quantum dot may exhibit increased blue light absorption. In the UV-Vis absorption spectrum curve of the quantum dot, a ratio of an intensity at a wavelength of 450 nm relative to an intensity at a wavelength of 600 nm at the same concentration (weight ratio) may be greater than or equal to about 2.0:1, greater than or equal to about 2.5:1, greater than or equal to about 3:1, or greater than or equal to about 3.5:1.

In a quantum dot of an embodiment, a luminous center may be present in a quantum well, not in a seed. In other words, charge carriers may be at least partially (e.g., completely) confined or delocalized in the shell. Therefore, the emission wavelength may be controlled by controlling the thickness of the quantum well.

A quantum efficiency of the quantum dot according to an embodiment may be greater than or equal to about 5%, for example, greater than or equal to about 10%, greater than or equal to about 15%, greater than or equal to about 20%, greater than or equal to about 25%, greater than or equal to about 30%, greater than or equal to about 40%, greater than or equal to about 50%, greater than or equal to about 60%, or greater than or equal to about 70%. The quantum dot of an embodiment may have a full width at half maximum (FWHM) of less than or equal to about 100 nm, for example, less than or equal to about 80 nm, less than or equal to about 70 nm, less than or equal to about 60 nm, less than or equal to about 50 nm, less than or equal to about 40 nm, or less than or equal to about 35 nm.

The quantum dot may have a non-spherical shape. The shape of the quantum dot may be controlled by changing a coating condition of a final shell.

The quantum dot of an embodiment may have a size of greater than or equal to about 4 nm, of greater than or equal to about 5 nm, or of greater than or equal to about 6 nm. The quantum dot of an embodiment may have a size of less than or equal to about 20 nm, less than or equal to about 19 nm, less than or equal to about 18 nm, less than or equal to about 17 nm, less than or equal to about 16 nm, less than or equal to about 15 nm, less than or equal to about 14 nm, less than or equal to about 13 nm, less than or equal to about 12 nm, or less than or equal to about 10 nm. As used herein, the size of a quantum dot is a value calculated assuming a spherical shape from a 2D image obtained from an electron microscope photograph of the quantum dot. As used herein, a size or a term regarding a size (e.g., diameter, thickness, or the like) may also refer to an average value thereof.

The quantum dot according to an embodiment is configured to form a population emitting green light and an average size of the quantum dots of the population may be greater than or equal to about 5.5 nm, greater than or equal to about 5.6 nm, greater than or equal to about 5.7 nm, greater than or equal to about 5.8 nm, greater than or equal to about 5.9 nm, or greater than or equal to about 6.0 nm and less than or equal to about 15 nm, less than or equal to about 14 nm, less than or equal to about 13 nm, less than or equal to about 12 nm, less than or equal to about 11 nm, or less than or equal to about 10 nm.

The quantum dot according to an embodiment is configured to form a population emitting red light and an average size of the quantum dots of the population may be greater than or equal to about 6.5 nm, greater than or equal to about 6.6 nm, greater than or equal to about 6.7 nm, greater than or equal to about 6.8 nm, greater than or equal to about 6.9 nm, greater than or equal to about 7.0 nm, greater than or equal to about 7.1 nm, greater than or equal to about 7.2 nm, greater than or equal to about 7.3 nm, greater than or equal to about 7.4 nm, or greater than or equal to about 7.5 nm and less than or equal to about 15 nm, less than or equal to about 14 nm, less than or equal to about 13 nm, less than or equal to about 12 nm, less than or equal to about 11 nm, or less than or equal to about 10 nm.

The quantum dot according to an embodiment is prepared by colloid synthesis, and thus may include an organic ligand, an organic solvent, or a combination thereof as described below on a surface of the quantum dot. The organic ligand, the organic solvent, or a combination thereof may be bound to a surface of the quantum dot.

Accordingly, in an embodiment, a method of producing the aforementioned quantum dot includes obtaining a seed including a first semiconductor nanocrystal including a Group II-VI compound; forming a quantum well including a second semiconductor nanocrystal including Group IIIA metal except aluminum and Group V element, on the seed; and forming a shell including a third semiconductor nanocrystal including a Group II-VI compound, on the quantum well. The method may further include forming a buffer layer including a zinc-containing Group II-V compound, a zinc-containing Group II-III-V compound, an aluminum phosphorus oxide, or a combination thereof, directly on the seed.

Details of the seed, the quantum well (including the buffer layer), and the shell are the same as described above. Depending on the composition of the seed, the quantum well, and the shell, metal and non-metal precursors may be selected appropriately. The metal precursor may include a metal powder, alkylated metal, a metal carboxylate, a metal hydroxide, a metal halide, a metal oxide, a metal inorganic salt (e.g., nitrate, etc.), a metal sulfate, a metal acetylacetonate, or a combination thereof, but is not limited thereto.

The non-metal precursor may be selected from non-nitrogen containing compounds used in quantum dot synthesis.

Hereinafter, a production of a quantum dot including a seed including a first semiconductor nanocrystal including zinc selenide, a quantum well including a second semiconductor nanocrystal including indium and phosphorus, and a shell including zinc and a chalcogen element (e.g., sulfur, selenium, or a combination thereof) is described, but the present disclosure is not limited thereto.

For the formation of the seed, a zinc precursor and a selenium precursor are reacted in an organic solvent in the presence of an organic ligand. The method may further include separating the formed seed.

The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR, $RPO(OH)_2$, RPOOH, RHPOOH, $R_2POOH$ (wherein, R is the same or different and is each independently hydrogen, a substituted or unsubstituted C1 to C40 aliphatic hydrocarbon (e.g., a C1 to C40 alkyl group, a C2 to C40 alkenyl group, a C2 to C40 alkynyl group, etc.), a substituted or unsubstituted C6 to C40 aromatic hydrocarbon (e.g., a C6 to C20 aryl group), or a combination thereof, provided that at least one R is not hydrogen), or a combination thereof. The organic ligand may coordinate with, e.g., be bound to, the surface of the obtained nanocrystal and may aid with dispersibility of the nanocrystal in the solution, affect luminescence and electrical characteristics of quantum dots, or a combination thereof. Examples of the organic ligand may include methane thiol, ethane thiol, propane thiol, butane thiol, pentane thiol, hexane thiol, octane thiol, dodecane thiol, hexadecane thiol, octadecane thiol, benzyl thiol; methane amine, ethane amine, propane amine, butyl amine, pentyl amine, hexyl amine, octyl amine, dodecyl amine, hexadecyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; a phosphine such as a substituted or unsubstituted methyl phosphine (e.g., trimethyl phosphine, methyldiphenyl phosphine, etc.), a substituted or unsubstituted ethyl phosphine (e.g., triethyl phosphine, ethyldiphenyl phosphine, etc.), a substituted or unsubstituted propyl phosphine, a substituted or unsubstituted butyl phosphine, a substituted or unsubstituted pentyl phosphine, or a substituted or unsubstituted octylphosphine (e.g., trioctylphosphine (TOP)); a phosphine oxide such as a substituted or unsubstituted methyl phosphine oxide (e.g., trimethyl phosphine oxide, methyldiphenyl phosphineoxide, etc.), a substituted or unsubstituted ethyl phosphine oxide (e.g., triethyl phosphine oxide, ethyldiphenyl phosphineoxide, etc.), a substituted or unsubstituted propyl phosphine oxide, a substituted or unsubstituted butyl phosphine oxide, or a substituted or unsubstituted octyl phosphine oxide (e.g., trioctylphosphineoxide (TOPO); diphenyl phosphine, triphenyl phosphine, or an oxide compound thereof; phosphonic acid, and the like, but are not limited thereto. One or more, e.g., two or more, organic ligands may be used. The organic ligand may be a mixture of carboxylic acid and amine.

The organic solvent may be a C6 to C22 primary amine such as hexadecylamine; a C6 to C22 secondary amine such as dioctylamine; a C6 to C40 tertiary amine such as trioctylamine; a nitrogen-containing heterocyclic compound such as pyridine; a C6 to C40 aliphatic hydrocarbon (e.g., alkane, alkene, alkyne, etc.) such as hexadecane, octadecane, octadecene, or squalane; a C6 to C30 aromatic hydrocarbon such as phenyldodecane, phenyltetradecane, or phenyl hexadecane; phosphine substituted with a C6 to C22 alkyl group such as trioctylphosphine, a phosphine oxide substituted with a C6 to C22 alkyl group such as trioctylphosphine oxide; a C12 to C22 aromatic ether such as phenyl ether, or benzyl ether, or a combination thereof. The organic solvent and an amount of the organic solvent may be appropriately selected taking into consideration the precursor(s) and organic ligand(s).

The precursor is not particularly limited and may be appropriately selected. In an embodiment, the zinc precursor may be appropriately selected. Examples of the zinc precursor may be a Zn metal powder, an alkylated Zn compound (e.g., dimethyl zinc, diethyl zinc, etc.), Zn alkoxide, Zn carboxylate, Zn nitrate, Zn perchlorate, Zn sulfate, Zn acetylacetonate, Zn halide, Zn cyanide, Zn hydroxide, Zn oxide, Zn peroxide, or a combination thereof. One or more, e.g., two or more, zinc precursor may be used.

The selenium precursor may include selenium-trioctylphosphine (Se-TOP), selenium-tributylphosphine (Se- TBP), selenium-triphenylphosphine (Se-TPP), selenium-diphenylphosphine (Se-DPP), or a combination thereof, but is not limited thereto.

The reaction may be performed at a temperature of greater than or equal to about 280° C., for example, greater than or equal to about 290° C. The reaction temperature may be less than or equal to about 350° C. A reaction time may be less than about 1 hour, for example, less than or equal to about 50 minutes. The reaction time may be greater than or equal to about 20 minutes, for example, greater than or equal to about 30 minutes.

The formed seed may be separated by addition of a nonsolvent, but is not limited thereto. For example, the addition of a nonsolvent to the prepared final reaction solution may allow nanocrystals coordinated with, e.g., bound to, the organic ligands to be separated (e.g., precipitated). The separated seeds may be washed using the nonsolvent. The nonsolvent may be a polar solvent that is miscible with the solvent used in the reaction and nanocrystals are not dispersible therein.

The nonsolvent may be selected depending on the organic solvent used in the reaction and may be for example, acetone, ethanol, butanol, isopropanol, ethanediol, water, tetrahydrofuran (THF), dimethylsulfoxide (DMSO), diethylether, formaldehyde, acetaldehyde, a solvent having a similar solubility parameter to the foregoing solvents, or a combination thereof. The separation may be performed through a centrifugation, precipitation, chromatography, or distillation. The separated nanocrystals may be added to the washing solvent and then washed as desired. The washing solvent is not particularly limited, and a solvent having a solubility parameter similar to that of the ligand may be used. Examples thereof may include hexane, heptane, octane, chloroform, toluene, and benzene.

For the formation of the quantum well, an indium precursor and a phosphor precursor may be reacted in an organic solvent in the presence of an organic ligand and the seed.

The forming of the quantum well may further include forming the aforementioned buffer layer. The forming of the buffer layer may contribute to the formation of quantum dots having the aforementioned composition and the aforementioned optical properties (e.g., the UV-vis absorption spectrum curve without a first absorption peak). Without being bound by any particular theory, the forming of the quantum well on the seed may be more stable and the quantum well layer may more uniformly coat the surface of the seed when forming the buffer layer. Without being bound by any particular theory, this structural difference is believed to be confirmed by the UV-Vis absorption spectrum of the quantum dot of an embodiment. In other words, it is believed that the quantum dot of an embodiment may have an ideal colloid-type quantum well structure and may exhibit the aforementioned UV-Vis absorption spectrum.

The seed on which the buffer layer is formed may be separated and washed and then re-introduced into the formation of the desired quantum well layer.

In the formation of the quantum well (with the formation of the buffer layer as desired), the metal/non-metal precursor and an amount of the metal/non-metal precursor may be selected taking into consideration a composition and a thickness of the quantum well (including the buffer layer as desired).

Hereinafter, in the case of quantum well is based on indium and phosphorus (e.g., indium phosphide) and the buffer layer therefor includes indium zinc phosphide, aluminum phosphine oxide, or a combination thereof, the precursors are described below but are not limited thereto.

The indium precursor may be appropriately selected. Examples of the indium precursor may be trimethyl indium, an indium carboxylate such as indium acetate, indium palmitate, or indium stearate, indium hydroxide, indium chloride, indium oxide, indium nitrate, indium sulfate, or a combination thereof.

The phosphorus precursor may be appropriately selected. Examples of the phosphorus precursor may be tris(trimethylsilyl)phosphine, tris(dimethylamino) phosphine, triethylphosphine, tributylphosphine, trioctylphosphine, triphenylphosphine, tricyclohexylphosphine, or a combination thereof.

An aluminum precursor may be appropriately selected. Examples of the aluminum precursor may be an aluminum metal powder, an aluminum carboxylate such as aluminum oleate, aluminum monostearate, or aluminum octanoate, aluminum acetylacetonate, an aluminum halide such as aluminum chloride, an aluminum alkoxide such as aluminum isopropoxide, aluminum oxide, alkylated aluminum, or a combination thereof, but are not limited thereto.

A zinc precursor may be appropriately selected. Examples of the zinc precursor are the same as described above. The organic ligands and organic solvents that may be used to form the quantum well are the same as described above.

The reaction for formation of the quantum well may be performed at a temperature of greater than or equal to about 200° C., for example, greater than or equal to about 210° C., greater than or equal to about 220° C., greater than or equal to about 230° C., greater than or equal to about 240° C., or greater than or equal to about 250° C. and less than or equal to about 300° C., less than or equal to about 290° C., less than or equal to about 280° C., or less than or equal to about 270° C.

When the quantum well includes the buffer layer, a temperature for the formation of the buffer layer may be lower than the temperature for the formation of the quantum well. For example, the temperature for the formation of the buffer layer may be for example, greater than or equal to about 150° C., greater than or equal to about 160° C., greater than or equal to about 170° C., greater than or equal to about 180° C., or greater than or equal to about 190° C. The temperature may be less than or equal to about 230° C., for example, less than or equal to about 220° C., or less than or equal to about 210° C.

The reaction time for formation of the quantum well, the buffer layer, or a combination thereof, as desired, may be controlled by taking into consideration reactivity of the precursors, a reaction temperature, and a desired quantum well thickness. In an embodiment, the reaction time may be adjusted to less than or equal to about 4 hours, for example, less than or equal to about 3 hours. The reaction time may be greater than or equal to about 20 minutes, for example, greater than or equal to about 30 minutes.

A thickness of the buffer layer may be appropriately selected and is not particularly limited. For example, the thickness of the buffer layer may be about 0.5 monolayers (ML) or more, for example, about 0.6 ML or more, about 0.7 ML or more, about 0.8 ML or more, about 0.9 ML or more, or about 1 ML or more, and about 2.0 monolayers or less, for example, about 1.9 ML or less, about 1.8 ML or less, about 1.7 ML or less, about 1.6 ML or less, or about 1.5 ML or less. The thickness of the buffer layer may be controlled by amounts of the precursor(s) used, a reaction temperature, and a reaction time. Without being bound by any particular theory, a portion of the buffer layer may disappear during a subsequent process of forming the quantum well layer. Because of the presence of this buffer layer, the quantum well layer may have improved quality (e.g., have the smaller number of defects or no defects) and be uniformly disposed on the seed, and accordingly, the quantum dots according to an embodiment may form a quantum dot population having a reduced size distribution.

Particles where the quantum well is formed may be separated by adding a nonsolvent to a reaction system. The separated particles may be optionally washed. In formation of the quantum well, details of the organic ligand, the nonsolvent, and the like are the same as described above.

In order to form a shell on the quantum well, a metal precursor (e.g., a zinc precursor) and a non-metal precursor (e.g., a selenium precursor, a sulfur precursor, or a combination thereof) may be reacted in an organic solvent under presence of the organic ligand and the particles having the quantum well.

Details of the organic ligand, the zinc precursor, the selenium precursor, and the organic solvent are the same as described above.

The sulfur precursor may be appropriately selected. The sulfur precursor may be hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), bistrimethylsilyl sulfur, ammonium sulfide, sodium sulfide, or a combination thereof.

The reaction for forming the shell may be performed at greater than about 200° C., for example, greater than or equal to about 210° C., greater than or equal to about 220° C., greater than or equal to about 230° C., greater than or equal to about 240° C., greater than or equal to about 250° C., greater than or equal to about 260° C., greater than or equal to about 270° C., greater than or equal to about 280° C., greater than or equal to about 290° C. and less than or equal to about 350° C., or less than or equal to about 340° C.

Reaction time for forming the shell may be controlled by taking into consideration reactivity of the precursors, the reaction temperature, and a desired shell thickness. In an embodiment, the reaction time may be less than or equal to about 3 hours, for example, less than or equal to about 2 hours, or less than or equal to about 1 hour. The reaction time may be greater than or equal to about 20 minutes, for example, greater than or equal to about 30 minutes.

In each of the aforementioned steps, a type, a content, or a combination thereof of the precursors or a ratio therebetween may be determined by taking into consideration a composition thereof in a final quantum dot (a seed, a quantum well, and a shell), reactivity thereof, and the like.

Each of the aforementioned steps (e.g., the formation of the seed, the formation of the quantum well optionally including the buffer layer, and the formation of the shell) may include heating (or vacuum-treating) the organic solvent and the metal precursor optionally with a ligand compound at a predetermined temperature (e.g., greater than or equal to about 100° C.) under vacuum and heating them again at a predetermined temperature (e.g., greater than or equal to about 100° C.) after converted into an inert gas atmosphere.

Injection of the metal precursor, the non-metal precursor, or a combination thereof may be sequentially or simultaneously performed, and a temperature of injecting the precursors may be appropriately determined. For example, when a multi-layered shell or a multi-layered quantum well is formed, the metal precursor(s), non-metal precursor(s), or a combination thereof forming the shell may be injected several times in a different ratio during the reaction time.

Quantum dots applied to a color filter may be provided in a shape of a composite pattern in which the quantum dots are dispersed in a host matrix (e.g., including a polymer, an inorganic material, or a combination thereof). The weight of quantum dots that may be included in the composite may be limited for the various reasons in a process. The quantum dot according to an embodiment exhibits increased blue light absorption, so the quantum dot may exhibit improved blue light absorption even at a limited weight. The composition according to an embodiment includes the aforementioned quantum dot, and a quantum dot pattern or a pattern of the quantum dot polymer composite may be provided. The produced pattern may exhibit improved blue light absorption.

The composition according to an embodiment includes the aforementioned (e.g., a plurality of) quantum dot(s); a dispersing agent; and an (organic) solvent. The dispersing agent may include a binder polymer including a carboxylic acid group. The composition may further include a photopolymerizable monomer including a carbon-carbon double bond and optionally (thermal or photo) initiator.

An amount of the quantum dot in the composition may be appropriately adjusted taking into consideration a desirable final use (e.g., color filter, etc.). In an embodiment, the amount of the quantum dot may be greater than or equal to about 1 weight percent (wt %), for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 15 wt %, greater than or equal to about 20 wt %, greater than or equal to about 25 wt %, greater than or equal to about 30 wt %, greater than or equal to about 35 wt %, or greater than or equal to about 40 wt %, based on a solid content of the composition. The amount of the quantum dot may be less than or equal to about 70 wt %, for example, less than or equal to about 65 wt %, less than or equal to about 60 wt %, less than or equal to about 55 wt %, or less than or equal to about 50 wt %, based on a solid content of the composition.

The composition according to an embodiment may be used to produce a quantum dot-polymer composite pattern. The composition according to an embodiment may be a quantum dot-containing photoresist composition to which a photolithography method may be applied. The composition according to an embodiment may be an ink composition that may provide a pattern by printing (e.g., a droplet discharge method such as inkjet printing). The composition according to an embodiment may not include a conjugated polymer (except a cardo binder that will be described later). The composition according to an embodiment may include a conjugated polymer. Herein, the conjugated polymer refers to a polymer having a conjugation double bond in its main chain (e.g., polyphenylenevinylene, etc.).

In the composition according to an embodiment, a dispersing agent may ensure dispersion of the quantum dot. In an embodiment, the dispersing agent may be a binder polymer. The binder polymer may include a carboxylic acid group, and may also be referred to as a polymer including the carboxylic acid group. The binder polymer may include a copolymer of a monomer mixture including a first monomer including a carboxylic acid group and a carbon-carbon double bond, a second monomer including a carbon-carbon double bond and a hydrophobic moiety and not including a carboxylic acid group, and optionally a third monomer including a carbon-carbon double bond and a hydrophilic moiety and not including a carboxylic acid group;

a multiple aromatic ring-containing polymer having a backbone structure in which two aromatic rings are bound to a quaternary carbon atom that is a constituent atom of another cyclic moiety in a main chain of the backbone structure, the multiple aromatic ring-containing polymer including a carboxylic acid group (—COOH) (hereinafter, a cardo binder); or a combination thereof.

The copolymer includes a first repeating unit derived from the first monomer and a second repeating unit derived from the second monomer, and optionally a third repeating unit derived from the third monomer.

Examples of the first monomer may include a carbonic acid vinyl ester compound such as acrylic acid, methacrylic acid, maleic acid, itaconic acid, fumaric acid, 3-butenoic acid, vinyl acetate, or vinyl benzoate, but are not limited thereto. As the first monomer, one or more compounds may be used. Examples of the second monomer may be an alkenyl aromatic compound such as styrene, alpha-methyl styrene, vinyl toluene, or vinyl benzyl methyl ether; an unsaturated carbonic acid ester compound such as methyl acrylate, methyl methacrylate, ethyl acrylate, ethyl methacrylate, butyl acrylate, butyl methacrylate, benzyl acrylate, benzyl methacrylate, cyclohexyl acrylate, cyclohexyl methacrylate, phenyl acrylate, or phenyl methacrylate; an unsaturated carbonic acid amino alkyl ester compound such as 2-amino ethyl acrylate, 2-amino ethyl methacrylate, 2-dimethyl amino ethyl acrylate, or 2-dimethyl amino ethyl methacrylate; a maleimide such as N-phenylmaleimide, N-benzylmaleimide, N-alkylmaleimide; an unsaturated carbonic acid glycidyl ester compound such as glycidyl acrylate or glycidyl methacrylate; a vinyl cyanide compound such as acrylonitrile, methacrylonitrile; or an unsaturated amide compound such as acryl amide or methacryl amide, but are not limited thereto. As the second monomer, one or more compounds may be used. Specific examples of the third monomer may include 2-hydroxy ethyl acrylate, 2-hydroxy ethyl methacrylate, 2-hydroxy butyl acrylate, or 2-hydroxy butyl methacrylate, but are not limited thereto. As the third monomer, one or more compounds may be used.

In the polymer including the carboxylic acid group, an amount of the first repeating unit or the second repeating unit may independently be greater than or equal to about 10 mole percent (mol %), for example, greater than or equal to about 15 mol %, greater than or equal to about 25 mol %, or greater than or equal to about 35 mol %, based on a total number of moles in the polymer including the carboxylic acid group. In the binder including a carboxylic acid group, an amount of the first repeating unit or the second repeating unit may be less than or equal to about 90 mol %, for example, 89 mol %, less than or equal to about 80 mol %, less than or equal to about 70 mol %, less than or equal to about 60 mol %, less than or equal to about 50 mol %, less than or equal to about 40 mol %, less than or equal to about 35 mol %, or less than or equal to about 25 mol %, based on a total number of moles in the binder including the carboxylic acid group. In the polymer including the carboxylic acid group, if present, an amount of the third repeating unit may be greater than or equal to about 1 mol %, for example, greater than or equal to about 5 mol %, greater than or equal to about 10 mol %, or greater than or equal to about 15 mol %, based on a total number of moles in the carboxylic acid polymer. In the binder polymer, an amount of the third repeating unit may be less than or equal to about 30 mol %, for example, less than or equal to about 25 mol %, less than or equal to about 20 mol %, less than or equal to about 18 mol %, less than or equal to about 15 mol %, or less than or equal to about 10 mol %, based on a total number of moles in the binder polymer r.

The polymer including the carboxylic acid group may include a multiple aromatic ring-containing polymer. The multiple aromatic ring-containing polymer is known as a cardo binder resin and may commercially available.

The polymer including the carboxylic acid group may have an acid value of greater than or equal to about 50 milligrams of potassium hydroxide per gram (mg KOH/g). For example, the carboxylic acid polymer may have an acid value of greater than or equal to about 60 mg KOH/g, greater than or equal to about 70 mg KOH/g, greater than or equal to about 80 mg KOH/g, greater than or equal to about 90 mg KOH/g, greater than or equal to about 100 mg KOH/g, greater than or equal to about 110 mg KOH/g, greater than or equal to about 120 mg KOH/g, greater than or equal to about 125 mg KOH/g, or greater than or equal to about 130 mg KOH/g. The acid value of the polymer may be for example less than or equal to about 250 mg KOH/g, less than or equal to about for example, 240 mg KOH/g, less than or equal to about 230 mg KOH/g, less than or equal to about 220 mg KOH/g, less than or equal to about 210 mg KOH/g, less than or equal to about 200 mg KOH/g, less than or equal to about 190 mg KOH/g, less than or equal to about 180 mg KOH/g, or less than or equal to about 160 mg KOH/g, but is not limited thereto. The binder polymer may have a weight average molecular weight of greater than or equal to about 1,000 grams per mole (g/mol), for example, greater than or equal to about 2,000 g/mol, greater than or equal to about 3,000 g/mol, or greater than or equal to about 5,000 g/mol. The binder polymer may have a weight average molecular weight of less than or equal to about 100,000 g/mol, for example less than or equal to about 50,000 g/mol.

In the composition, an amount of the binder polymer may be greater than or equal to about 0.5 wt %, for example, greater than or equal to about 1 wt %, greater than or equal to about 5 wt %, greater than or equal to about 10 wt %, greater than or equal to about 15 wt %, or greater than or equal to about 20 wt %, based on a total weight of the composition, but is not limited thereto. The amount of the binder polymer may be less than or equal to about 35 wt %, for example less than or equal to about 33 wt %, or less than or equal to about 30 wt %, based on a total weight of the composition. Within the ranges, dispersion of the quantum dot may be ensured. The amount of the binder polymer may be about 0.5 wt % to about 55 wt %, based on a total solid weight of the composition.

In the composition, the polymerizable (e.g., photopolymerizable) monomer including the carbon-carbon double bond may include a (e.g., photopolymerizable) acryl-based monomer. The monomer may be a precursor for an insulating polymer. The acryl-based monomer may include alkyl (meth)acrylate, ethylene glycol di(meth)acrylate, triethylene glycol di(meth)acrylate, diethylene glycol di(meth)acrylate, 1,4-butanediol di(meth)acrylate, 1,6-hexanediol di(meth) acrylate, neopentyl glycol di(meth)acrylate, pentaerythritol di(meth)acrylate, pentaerythritol tri(meth)acrylate, pentaerythritol tetra(meth)acrylate, dipentaerythritol di(meth) acrylate, dipentaerythritol tri(meth)acrylate, dipentaerythritol penta(meth)acrylate, pentaerythritol hexa(meth)acrylate, bisphenol A di(meth)acrylate, bisphenol A epoxy(meth)acrylate, trimethylolpropane tri(meth)acrylate, ethylene glycol monomethyl ether (meth)acrylate, novolac epoxy (meth) acrylate, diethylene glycol di(meth)acrylate, triethylene glycol di(meth)acrylate, propylene glycol di(meth)acrylate, tris(meth)acryloyloxyethyl phosphate, or a combination thereof.

An amount of the monomer may be greater than or equal to about 0.5 wt %, for example, greater than or equal to about 1 wt % or greater than or equal to about 2 wt %, based on a total weight of the composition. The amount of the (photopolymerizable) monomer may be less than or equal to about 30 wt %, less than or equal to about for example, 28 wt %, less than or equal to about 25 wt %, less than or equal to about 23 wt %, less than or equal to about 20 wt %, less than or equal to about 18 wt %, less than or equal to about 17 wt %, less than or equal to about 16 wt %, or less than or equal to about 15 wt %, based on a total weight of the composition.

The initiator in the composition may be used for polymerization of the monomers. The initiator is a compound accelerating a radical reaction (e.g., radical polymerization of monomer) by producing radical chemical species under a mild condition (e.g., by heat or light). The initiator may be a thermal initiator or a photoinitiator. The initiator is a compound capable of initiating a radical polymerization of the polymerizable acrylic monomer, a thiol compound, or a combination thereof (will be described later) by light. The type of the initiator is not particularly limited. The initiator may be a thermal initiator. The thermal initiator may include azobisisobutyronitrile, benzoyl peroxide, and the like, but is not limited thereto. The initiator may be a photoinitiator. The photoinitiator may include a triazine-based compound, an acetophenone compound, a benzophenone compound, a thioxanthone compound, a benzoin compound, an oxime ester compound, an aminoketone compound, a phosphine or phosphineoxide compound, a carbazole-based compound, a diketone compound, a sulfonium borate-based compound, a diazo-based compound, a biimidazole-based compound, or a combination thereof, but is not limited thereto.

In the composition, an amount of the initiator may be appropriately adjusted taking into consideration the polymerizable monomers and amounts of the polymerizable monomers. In an embodiment, the initiator may be used in an amount range of about 0.01 wt % to about 10 wt %, based on a total weight of the composition, but is not limited thereto.

The composition may further include a (multiple or mono-functional) thiol compound including a thiol group at a terminal end of the thiol compound, a metal oxide particulate, or a combination thereof.

The metal oxide particulate may include $TiO_2$, $SiO_2$, $BaTiO_3$, $Ba_2TiO_4$, ZnO, or a combination thereof. In the composition, an amount of the metal oxide may be greater than or equal to about 1 wt % and less than or equal to about 15 wt %, less than or equal to about 10 wt %, or less than or equal to about 5 wt %, based on that of a solid content in the composition. The metal oxide particulate may have an appropriately selected diameter without a particular limit. The diameter of the metal oxide particulate may be greater than or equal to about 100 nm, for example, greater than or equal to about 150 nm, or greater than or equal to about 200 nm and less than or equal to about 1,000 nm or less than or equal to about 800 nm.

The multiple thiol compound may include a compound represented by Chemical Formula 1:

Chemical Formula 1

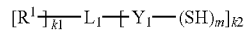

wherein, in Chemical Formula 1, $R^1$ is hydrogen; a substituted or unsubstituted C1 to C30 linear or branched alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a C1 to C10 alkoxy group; a hydroxy group; $-NH_2$; a substituted or unsubstituted C1 to C30 amine group (—NRR', wherein R and R' are each independently hydrogen or a C1 to C30 linear or branched alkyl group provided that both are not simultaneously hydrogen); an isocyanate group; a halogen; —ROR' (wherein R is a substituted or unsubstituted C1 to C20 alkylene group and R' is hydrogen or a C1 to C20 linear or branched alkyl group); an acyl halide (—RC(=O)X, wherein R is a substituted or unsubstituted alkylene group and X is a halogen); —O(=O)OR' (wherein R' is hydrogen or a C1 to C20 linear or branched alkyl group); —ON; —O(=O)NRR'; or —C(=O)ONRR' (wherein R and R' are each independently hydrogen or a C1 to C20 linear or branched alkyl group), $L_1$ is a carbon atom, a substituted or unsubstituted C1 to C30 alkylene group, a substituted or unsubstituted C3 to C30 cycloalkylene group, a substituted or unsubstituted C6 to C30 arylene group, a substituted or unsubstituted C3 to C30 heterocycloalkylene group, or a substituted or unsubstituted C3 to C30 heteroarylene group, wherein a methylene moiety (—$CH_2$—) of the substituted C1 to C30 alkylene group may be replaced by a sulfonyl moiety (—$SO_2$—), a carbonyl moiety (CO), an ether moiety (—O—), a sulfide moiety (—S—), a sulfoxide moiety (—SO—), an ester moiety (—O(=O)O—), an amide moiety (—O(=O)NR—) (wherein R is hydrogen or a C1 to C10 alkyl group), or a combination thereof, $Y_1$ is a single bond; a substituted or unsubstituted C1 to C30 alkylene group; a substituted or unsubstituted C2 to C30 alkenylene group; a C1 to C30 alkylene group or a C2 to C30 alkenylene group wherein a methylene moiety (—$CH_2$—) is replaced by a sulfonyl moiety (—S(=O)$_2$—), a carbonyl moiety (—O(=O)—), an ether moiety (—O—), a sulfide moiety (—S—), a sulfoxide moiety (—S(=O)—), an ester moiety (—O(=O)O—), an amide moiety (—O(=O)NR—) (wherein R is hydrogen or a C1 to C10 linear or branched alkyl group), an imine moiety (—NR—) (wherein R is hydrogen or a C1 to C10 linear or branched alkyl group), or a combination thereof, m is an integer of 1 or greater, k1 is an integer of 0 or 1 or greater, k2 is an integer of 1 or greater, a sum of m and k2 is an integer of 3 or greater.

(For example, in case in which $Y_1$ is not a single bond) m may not exceed a valence of $Y_1$, and a sum of k1 and k2 may not exceed a valence of $L_1$.

The multiple thiol compound may be a dithiol compound, a trithiol compound, tetrathiol compound, or a combination thereof. For example, the thiol compound may be glycoldi-3-mercaptopropionate, glycol dimercapto acetate, trimethylolpropane tris(3-mercaptopropionate), pentaerythritol tetrakis (3-mercaptopropionate), pentaerythritol tetrakis (2-mercaptoacetate), 1,6-hexanedithiol, 1,3-propanedithiol, 1,2-ethanedithiol, polyethylene glycol dithiol including 1 to 10 ethylene glycol repeating units, or a combination thereof.

An amount of the thiol compound may be less than or equal to about 40 wt %, less than or equal to about 35 wt %, less than or equal to about 30 wt %, less than or equal to about 25 wt %, less than or equal to about 20 wt %, less than or equal to about 10 wt %, less than or equal to about 9 wt %, less than or equal to about 8 wt %, less than or equal to about 7 wt %, less than or equal to about 6 wt %, or less than or equal to about 5 wt %, based on a total weight of the composition. The amount of the thiol compound may be greater than or equal to about 0.1 wt %, for example, greater than or equal to about 0.5 wt %, greater than or equal to about 1 wt %, greater than or equal to about 1 wt %, greater than or equal to about 1 wt %, greater than or equal to about 5 wt %, greater than or equal to about 10 wt %, greater than or equal to about 15 wt %, greater than or equal to about 20 wt %, or greater than or equal to about 25 wt %, based on a total weight of the composition.

The composition may further include an organic solvent (or a liquid vehicle). The usable organic solvent is not particularly limited. A type and an amount of the organic solvent may be appropriately determined by taking into consideration the above main components (i.e., the quantum dot, the dispersing agent, the polymerizable monomer, the initiator, and if used, the thiol compound) and a type and an amount of an additive, which will be described later. The composition may include an organic solvent in a residual amount except for a desired amount of the (non-volatile) solid. Examples of the organic solvent (or liquid vehicle) may include ethyl 3-ethoxy propionate; an ethylene glycol such as ethylene glycol, diethylene glycol, or polyethylene glycol; a glycolether such as ethylene glycolmonomethylether, ethylene glycolmonoethylether, diethylene glycolmonomethylether, ethylene glycoldiethylether, or diethylene glycoldimethylether; a glycolether acetate such as ethylene glycol acetate, ethylene glycol monoethylether acetate, diethylene glycol monoethylether acetate, or diethylene glycol monobutylether acetate; a propylene glycol such as propylene glycol; a propylene glycolether such as propylene glycolmonomethyl ether, propylene glycol monoethyl ether, propylene glycol monopropyl ether, propylene monobutyl ether, propylene glycol dimethyl ether, dipropylene glycol dimethyl ether, propylene glycol diethyl ether, or dipropylene glycol diethyl ether; a propylene glycolether acetate such as propylene glycolmonomethyl ether acetate, or dipropylene glycol monoethyl ether acetate; an amide such as N-methylpyrrolidone, dimethyl formamide, or dimethyl acetamide; a ketone such as methylethylketone (MEK), methylisobutylketone (MIBK), or cyclohexanone; a petroleum such as toluene, xylene, or solvent naphtha; an ester such as ethyl acetate, butyl acetate, or ethyl lactate; an ether such as diethyl ether, dipropyl ether, or dibutyl ether; aliphatic, alicyclic, or aromatic hydrocarbons, and a mixture thereof.

If desired, the composition may further include various additives such as a light diffusing agent, a leveling agent, or a coupling agent in addition to the components. The amount of the additive is not particularly limited, and may be controlled within an appropriate range wherein the additive does not cause an adverse effect on preparation of the composition and production of the quantum dot-polymer composite and optionally a patterning of the composite.

If used, the additives may be used in an amount of greater than or equal to about 0.1 wt %, for example, greater than or equal to about 0.5 wt %, greater than or equal to about 1 wt %, greater than or equal to about 2 wt %, or greater than or equal to about 5 wt %, based on a total weight of the composition, but is not limited thereto. If used, the amount of the additives may be less than or equal to about 20 wt %, for example, less than or equal to about 19 wt %, less than or equal to about 18 wt %, less than or equal to about 17 wt %, less than or equal to about 16 wt %, or less than or equal to about 15 wt %, based on a total weight of the composition, but is not limited thereto.

The composition according to an embodiment may be prepared by a method including: preparing quantum dot dispersion including the aforementioned non-cadmium-based quantum dot, the dispersing agent, and the organic solvent; and mixing the quantum dot dispersion with the initiator; the polymerizable monomer (e.g., acryl-based monomer); optionally, the thiol compound; optionally, the metal oxide particulate, and optionally, the additives. Each of the aforementioned components may be mixed sequentially or simultaneously, but mixing orders are not particularly limited.

The composition may provide a quantum dot-polymer composite by a (e.g., radical) polymerization.

Accordingly, in an embodiment, the quantum dot-polymer composite includes a polymer matrix; and the aforementioned non-cadmium-based quantum dot dispersed in the polymer matrix. The polymer matrix may include a dispersing agent (e.g., a binder polymer including a carboxylic acid group), a polymerization product (e.g., insulating polymer) of a polymerizable monomer having a (for example, at least two, at least three, at least four, or at least five) carbon-carbon double bond, optionally a polymerization product of the polymerizable monomer and a multiple thiol compound including at least two thiol groups at a terminal end of the multiple thiol compound, a metal oxide particulate(s), or a combination thereof.

In an embodiment, the polymer matrix may include a cross-linked polymer and a dispersing agent (e.g., (carboxyl group-containing) binder polymer). In an embodiment, the polymer matrix does not include a conjugated polymer (except for cardo resin). The cross-linked polymer may include a thiolene resin, a cross-linked poly(meth)acrylate, or a combination thereof. In an embodiment, the cross-linked polymer may be a polymerization product of the polymerizable monomer and, optionally, the multiple thiol compound.

The non-cadmium-based quantum dot, the dispersing agent, or the binder polymer, the polymerizable monomer, and the multiple thiol compound are the same as described above.

The film of the quantum dot polymer composite or the quantum dot polymer composite pattern that will be described later may have for example a thickness, less than or equal to about 30 μm, for example less than or equal to about 25 μm, less than or equal to about 20 μm, less than or equal to about 15 μm, less than or equal to about 10 μm, less than or equal to about 8 μm, less than or equal to about 7 μm and greater than or equal to about 2 μm, for example, greater than or equal to about 3 μm, greater than or equal to about 3.5 μm, or greater than or equal to about 4 μm.

In an embodiment, patterned film includes a repeating section including a first section configured to emit a first light, wherein the first section includes the quantum dot polymer composite. The repeating section may include a second section emitting second light having different wavelength from the first light, wherein the second section may include a quantum dot polymer composite. The quantum dot polymer composite of the second section may include a second quantum dot configured to emit the second light. The second quantum dot may include the aforementioned non-cadmium-based quantum dot. The first light or the second light may be red light having a maximum photoluminescence peak wavelength which is present between about 600 nm and about 650 nm (e.g., about 620 nm to about 650 nm) or green light having a maximum photoluminescence peak wavelength which is present between about 500 nm and about 550 nm (e.g., about 510 nm to about 540 nm). The patterned film may further include a third section emitting or passing third light (e.g., blue light) different from the first light and the second light. The third light may have a maximum peak wavelength ranging from about 380 nm to about 480 nm.

In an embodiment, a display device includes a light source and a photoluminescence element, and the photoluminescence element includes a substrate and an emission layer disposed on the substrate, and the emission layer includes a film or patterned film of the quantum dot polymer composite. The light source is configured to provide the photoluminescence element with incident light. The incident light may have a photoluminescence peak wavelength of greater than or equal to about 440 nm, for example, greater than or equal to about 450 nm and less than or equal to about 500 nm, for example, less than or equal to about 480 nm, less than or equal to about 470 nm, or less than or equal to about 460 nm.

In the emission layer (e.g., patterned film of quantum dot polymer composite) of the display device according to an embodiment, the first section may be a section emitting red light, and the second section may be a section emitting green light, and the light source may be an element emitting blue light.

An optical element (e.g., a blue light blocking layer or a first optical filter which will be described below) for blocking (e.g., reflecting or absorbing) blue light may be disposed on a front surface (a light-emitting surface) of the first section, the second section, or a combination thereof.

In the display device, the light source may include a plurality of light emitting units corresponding to the first section and the second section, respectively, and the light emitting units may include a first electrode and a second electrode facing each other and an electroluminescence layer disposed between the first electrode and the second electrode. The electroluminescence layer may include an organic light emitting material. For example, each light emitting unit of the light source may include an electroluminescent device (e.g., an organic light emitting diode (OLED)) configured to emit light of a predetermined wavelength (e.g., blue light, green light, or a combination thereof). Structures and materials of the electroluminescent device and the organic light emitting diode (OLED) may be selected appropriately and are not particularly limited. The light source includes an organic light emitting diode (OLED) emitting blue light (and optionally, green light).

Figure 2:
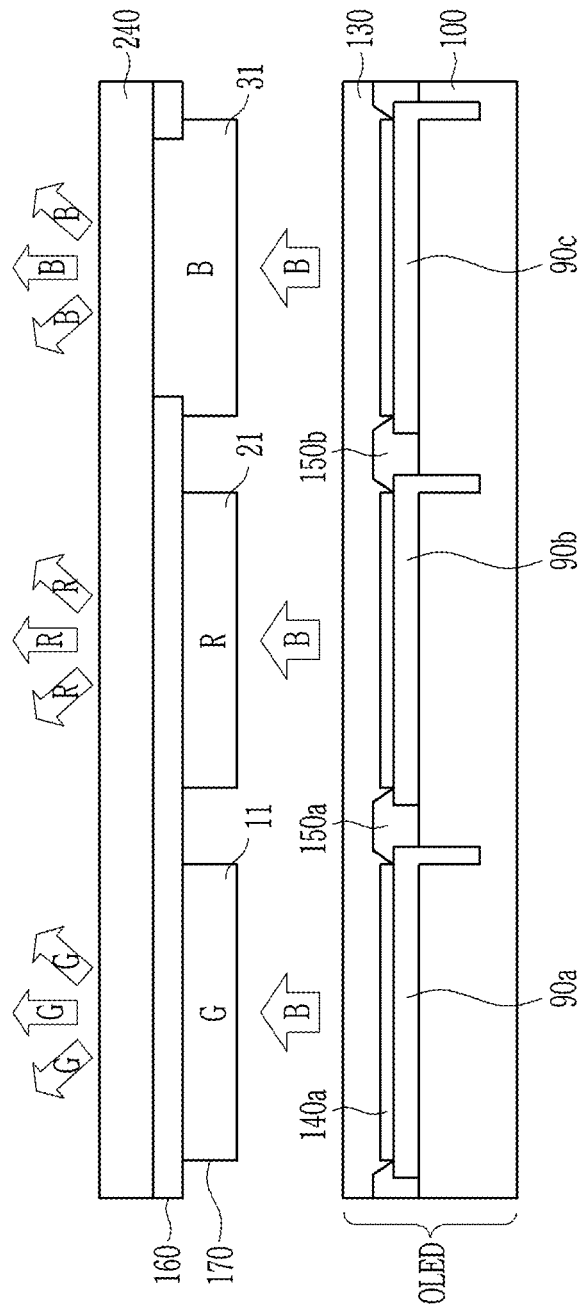
FIG. 2 is a schematic view showing a cross-section of a device according to an embodiment.
Figure 3:
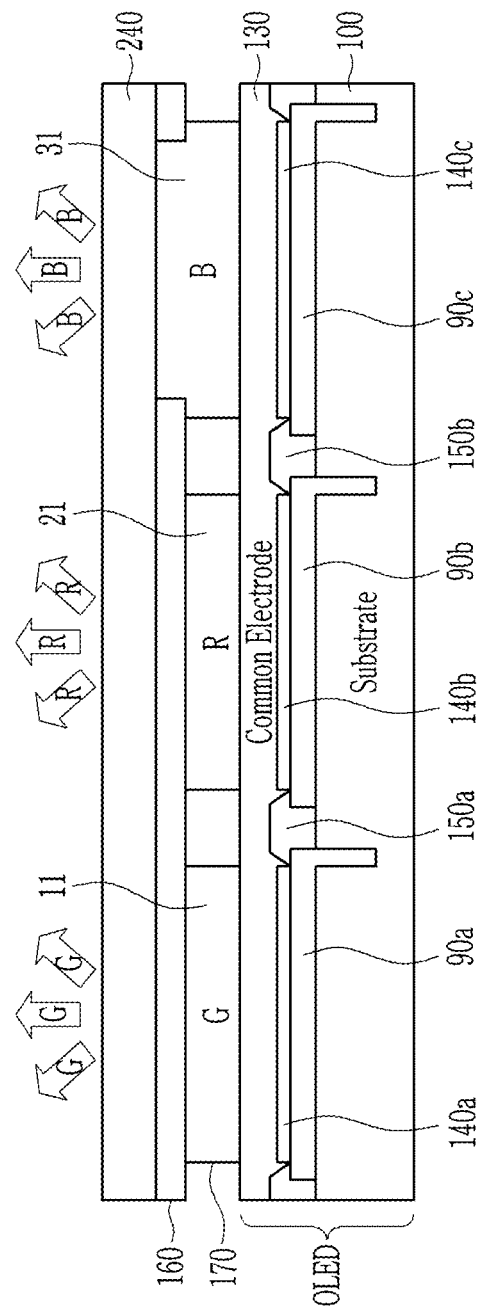
FIG. 3 is a schematic view showing a cross-section of a device according to an embodiment.

FIGS. 2 and 3 are schematic cross-sectional views of display devices according to an embodiment. Referring to FIGS. 2 and 3, a light source includes an organic light emitting diode (OLED) emitting blue light. The organic light emitting diode OLED may include (at least two, for example, three or more) pixel electrodes 90a, 90b, 90c formed on a substrate 100, a pixel defining layer 150a, 150b formed between the adjacent pixel electrodes 90a, 90b, 90c, an organic light emitting layer 140a, 140b, 140c formed on the pixel electrodes 90a, 90b, 90c, and a common electrode layer 130 formed on the organic light emitting layer 140a, 140b, 140c. A thin film transistor and a substrate may be disposed under the organic light emitting diode (OLED). The pixel areas of the OLED may be disposed corresponding to the first, second, and third sections that will be described in detail below, respectively.

A stack structure including a quantum dot-polymer composite (e.g., a section including red quantum dot and a section including green quantum dot) pattern and a substrate may be disposed on the light source. The sections are configured so that blue light emitted from the light source is entered thereinto and red light and green light may be emitted, respectively. The light (e.g., blue light) emitted from the light source may enter the second section 21 and the first section 11 of the quantum dot-polymer composite pattern 170 to emit (e.g., converted) red light R and green light G, respectively. The blue light B emitted from the light source passes through or transmits from the third section 31. Over the second section emitting red light, the first section emitting green light, or a combination thereof, an optical element 160 may be disposed. The optical element may be a blue cut layer which cuts (e.g., reflects or absorbs) blue light and optionally green light, or a first optical filter layer 310 (see FIG. 4). The blue cut layer 160 may be disposed on the upper substrate 240. The blue cut layer 160 may be disposed between the upper substrate 240 and the quantum dot-polymer composite pattern and over the first section 11 and the second section 21. Details of the blue cut layer are the same as set forth for the first optical filter layer 310 below.

The device may be obtained by separately fabricating the stack structure and (e.g., blue light emitting) LED or OLED and then assembling the same. Alternatively, the device may be obtained by forming a quantum dot polymer composite pattern directly on the LED or OLED.

The substrate may be a substrate including an insulating material. The substrate may include glass; various polymers such as polyester of polyethyleneterephthalate (PET), or polyethylenenaphthalate (PEN), polycarbonate, and polyacrylate; polysiloxane (e.g., polydimethylsiloxane (PDMS)); an inorganic material such as $Al_2O_3$ or ZnO; or a combination thereof, but is not limited thereto. A thickness of the substrate may be appropriately selected taking into consideration a substrate material but is not particularly limited. The substrate may have flexibility. The substrate may have a transmittance of greater than or equal to about 50%, greater than or equal to about 60%, greater than or equal to about 70%, greater than or equal to about 80%, or greater than or equal to about 90% for light emitted from the quantum dot.

A wire layer including a thin film transistor or the like is formed on the substrate. The wire layer may further include a gate line, a sustain voltage line, a gate insulating layer, a data line, a source electrode, a drain electrode, a semiconductor, a protective layer, and the like. The detail structure of the wire layer may be verified according to an embodiment. The gate line and the sustain voltage line are electrically separated from each other, and the data line is insulated and crossing the gate line and the sustain voltage line. The gate electrode, the source electrode, and the drain electrode form a control terminal, an input terminal, and an output terminal of the thin film transistor, respectively. The drain electrode is electrically connected to the pixel electrode that will be described later.

The pixel electrode may function as an anode of the display device. The pixel electrode may be formed of a transparent conductive material such as indium tin oxide (ITO) or indium zinc oxide (IZO). The pixel electrode may be formed of a material having a light-blocking properties such as gold (Au), platinum (Pt), nickel (Ni), tungsten (W), chromium (Cr), molybdenum (Mo), iron (Fe), cobalt (Co), copper (Cu), palladium (Pd), or titanium (Ti). The pixel electrode may have a two-layered structure in which the transparent conductive material and the material having light-blocking properties are stacked sequentially.

Between two adjacent pixel electrodes, a pixel define layer (PDL) may be overlapped with a terminal end of the pixel electrode to divide the pixel electrode into a pixel unit. The pixel define layer may be an insulation layer which may electrically block the at least two pixel electrodes.

The pixel define layer may cover a portion of the upper surface of the pixel electrode, and the remaining region of the pixel electrode that is not covered by the pixel define layer may provide an opening. An organic emission layer that will be described later may be formed on the region defined by the opening.

The organic emission layer defines each pixel area by the pixel electrode and the pixel define layer. In other words, one pixel area may be defined as an area formed with one organic emission unit layer which is contacted with one pixel electrode divided by the pixel define layer.

For example, in the display device according to an embodiment, the organic emission layer may be defined as a first pixel area, a second pixel area and a third pixel area, and each pixel area is spaced apart from each other leaving a predetermined interval by the pixel define layer.

In an embodiment, the organic emission layer may emit a third light belong to visible light region or belong to a UV region. In other words, each of the first to the third pixel areas of the organic emission layer may emit a third light. In an embodiment, the third light may be a light having the highest energy in the visible light region, for example, may be blue light. When all pixel areas of the organic emission layer are configured to emit the same light, each pixel area of the organic emission layer may be formed of the same or similar materials or may show, e.g., exhibit, the same or similar properties. Thus a process difficulty of forming the organic emission layer may be reduced, e.g., relieved, and the display device may be applied for, e.g., used in, a large scale/large area process. However, the organic emission layer according to an embodiment is not necessarily limited thereto, but the organic emission layer may be configured to emit at least two different lights.

The organic emission layer includes an organic emission unit layer in each pixel area, and the each organic emission unit layer may further include an auxiliary layer (e.g., hole injection layer (HIL), hole transport layer (HTL), electron transport layer (ETL), etc.) besides the emission layer.

The common electrode may function as a cathode of the display device. The common electrode may be formed of a transparent conductive material such as indium tin oxide (ITO) or indium zinc oxide (IZO). The common electrode may be formed on the organic emission layer and may be integrated therewith.

A planarization layer or a passivation layer (not shown) may be formed on the common electrode. The planarization layer may include a (e.g., transparent) insulating material for ensuring electrical insulation with the common electrode.

In an embodiment, the display device may further include a lower substrate, a polarizer disposed under the lower substrate, and a liquid crystal layer disposed between the stack structure and the lower substrate, and in the stack structure, the light emission layer may be disposed to face the liquid crystal layer. The display device may further include a polarizer between the liquid crystal layer and the emission layer. The light source may further include LED and if desired, a light guide panel.

Figure 4:
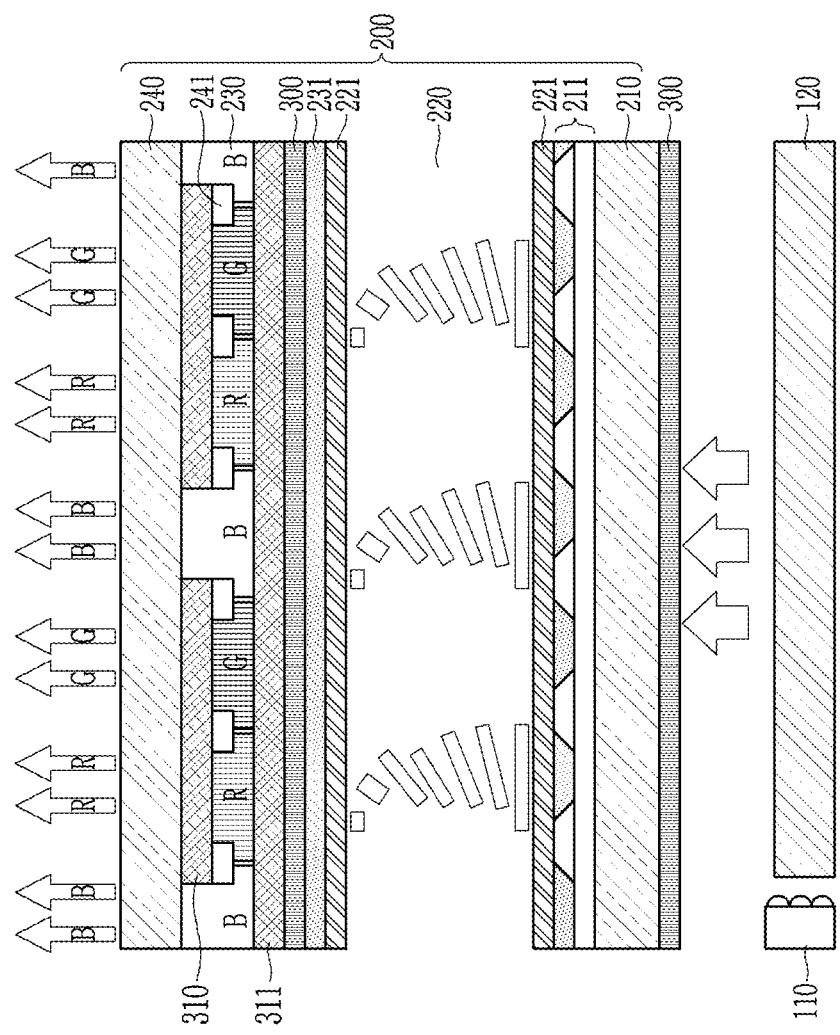
FIG. 4 is a schematic view showing a cross-section of a device according to an embodiment.

Non-limiting examples of the display device (e.g., a liquid crystal display device) according to an embodiment are illustrated with a reference to a drawing. FIG. 4 is a schematic cross sectional view showing a liquid crystal display according to an embodiment. Referring to FIG. 4, the display device of an embodiment includes a liquid crystal panel 200, a polarizer 300 disposed under the liquid crystal panel 200, and a backlight unit (BLU) disposed under the polarizer 300.

The liquid crystal panel 200 includes a lower substrate 210, a stack structure, and a liquid crystal layer 220 disposed between the stack structure and the lower substrate. The stack structure includes a transparent substrate 240 and a photoluminescent layer 230 including a pattern of a quantum dot polymer composite.

The lower substrate 210 which is also referred to as an array substrate may be a transparent insulating material substrate. The substrate is the same as described above. A wire plate 211 is provided on an upper surface of the lower substrate 210. The wire plate 211 may include a plurality of gate lines (not shown) and data lines (not shown) that define a pixel area, a thin film transistor disposed adjacent to a crossing region of gate lines and data lines, and a pixel electrode for each pixel area, but is not limited thereto. Details of such a wire plate are not particularly limited.

The liquid crystal layer 220 may be disposed on the wire plate 211. The liquid crystal layer 220 may include an alignment layer 221 on and under the liquid crystal layer 220 to initially align the liquid crystal material included therein. Details (e.g., a liquid crystal material, an alignment layer material, a method of forming liquid crystal layer, a thickness of liquid crystal layer, or the like) of the liquid crystal material and the alignment layer are not particularly limited.

A lower polarizer 300 is provided under the lower substrate. Materials and structures of the polarizer 300 are not particularly limited. A backlight unit (e.g., emitting blue light) may be disposed under the polarizer 300.

An upper optical element or an upper polarizer 300 may be provided between the liquid crystal layer 220 and the transparent substrate 240, but is not limited thereto. For example, the upper polarizer may be disposed between the liquid crystal layer 220 and the light emission layer 230. The polarizer may be any suitable polarizer for use in a liquid crystal display device. The upper polarizer may be TAC (triacetyl cellulose) having a thickness of less than or equal to about 200 μm, but is not limited thereto. In an embodiment, the upper optical element may be a coating that controls a refractive index without a polarization function.

The backlight unit includes a light source 110. The light source may emit blue light or white light. The light source may include a blue LED, a white LED, a white OLED, or a combination thereof, but is not limited thereto.

The backlight unit may further include a light guide panel 120. In an embodiment, the backlight unit may be an edge-type lighting. For example, the backlight unit may include a reflector (not shown), a light guide panel (not shown) provided on the reflector and providing a planar light source with the liquid crystal panel 200, an optical sheet (not shown) on the light guide panel, for example, a diffusion plate, a prism sheet, and the like, or a combination thereof, but is not limited thereto. In an embodiment, backlight unit does not include a light guide panel. In an embodiment, the backlight unit may be a direct lighting. For example, the backlight unit may have a reflector (not shown), and may have a plurality of fluorescent lamps disposed on the reflector at regular intervals, or may have an LED operating substrate on which a plurality of light emitting diodes may be disposed, a diffusion plate thereon, and optionally an optical sheet. Details (e.g., each component of a light emitting diode, a fluorescent lamp, light guide panel, various optical sheets, and a reflector) of such a backlight unit are not particularly limited.

A black matrix 241 is provided under the transparent substrate 240 and has openings and hides a gate line, a data line, and a thin film transistor of the wire plate on the lower substrate. For example, the black matrix 241 may have a lattice shape. The photoluminescent layer 230 is provided in the openings of the black matrix 241 and has a quantum dot-polymer composite pattern including a first section (R) configured to emit a first light (e.g., red light), a second section (G) configured to emit a second light (e.g., green light), and a third section (B) configured to emit/transmit, for example blue light. If desired, the photoluminescent layer may further include a fourth section. The fourth section may include a quantum dot that emits different color from light emitted from the first to third sections (e.g., cyan, magenta, and yellow light).

In the light emission (photoluminescent) layer 230, sections forming a pattern may be repeated corresponding to pixel areas formed on the lower substrate. A transparent common electrode 231 may be provided on the photoluminescent layer (e.g., the photoluminescent color filter layer).

The third section (B) configured to emit/transmit blue light may be a transparent color filter that does not change a photoluminescence spectrum of the light source. In this case, blue light emitted from the backlight unit may enter in a polarized state and may be emitted through the lower polarizer and the liquid crystal layer as is. If desired, the third section may include a quantum dot emitting blue light.

If desired, the display device may further include a blue light blocking layer (e.g., blue cut filter) or a first optical filter layer. The blue light blocking layer or the first optical filter layer may be disposed between (bottom surfaces of) the first section (R) and the second section (G) and the upper substrate 240 or on a top surface of the upper substrate 240. The blue light blocking layer may include a sheet having openings that correspond to a pixel area showing a blue color (e.g., third section) and may be formed on portions corresponding to the first and second sections. As shown in FIG. 4, the first optical filter layer may be integrally formed as one body structure at the remaining positions except positions overlapped with the third section, but is not limited thereto. At least two first optical filter layers may be spaced apart and be disposed on each of the positions overlapped with the first and the second sections.

For example, the first optical filter layer may block light having a portion of a wavelength region in the visible light region and transmit light having other wavelength regions. For example, the first optical filter layer may block blue light and transmit light except blue light. For example, the first optical filter layer may transmit green light, red light, and/or or yellow light that is mixed light thereof.

For example, the first optical filter layer may substantially block blue light having a wavelength of less than or equal to about 500 nm and may transmit light in other visible light wavelength region of greater than about 500 nm and less than or equal to about 700 nm.

For example, the first optical filter layer may have light transmittance of greater than or equal to about 70%, greater than or equal to about 80%, greater than or equal to about 90%, or about 100% with respect to the other visible light of greater than about 500 nm and less than or equal to about 700 nm.

The first optical filter layer may include a polymer thin film including a dye, a pigment, or a combination thereof that absorbs light having a wavelength to be blocked. The first optical filter layer may block greater than or equal to about 80%, greater than or equal to about 90%, or greater than or equal to about 95% of blue light having a wavelength of less than or equal to about 480 nm and may have light transmittance of greater than or equal to about 70%, greater than or equal to about 80%, greater than or equal to about 90%, or about 100% with respect to other visible light of greater than about 500 nm and less than or equal to about 700 nm.

The first optical filter layer may block (e.g., absorb) and substantially block blue light having a wavelength of less than or equal to about 500 nm and for example may selectively transmit green light or red light. In this case, at least two first optical filter layers may be spaced apart and disposed on each of the portions overlapped with the first and second sections, respectively. For example, a first optical filter layer selectively transmitting red light may be disposed on the portion overlapped with the section emitting red light and the first optical filter layer selectively transmitting green light may be disposed on the portion overlapped with the section emitting green light, respectively. For example, the first optical filter layer may include a first region, a second region, or a combination thereof wherein the first region blocks (e.g., absorb) blue light and red light and transmits light having a wavelength of a predetermined range (e.g., greater than or equal to about 500 nm, greater than or equal to about 510 nm, or greater than or equal to about 515 nm and less than or equal to about 550 nm, less than or equal to about 545 nm, less than or equal to about 540 nm, less than or equal to about 535 nm, less than or equal to about 530 nm, less than or equal to about 525 nm, or less than or equal to about 520 nm) and the second region blocks (e.g., absorb) blue light and green light and transmits light having a wavelength of a predetermined range (e.g., greater than or equal to about 600 nm, greater than or equal to about 610 nm, or greater than or equal to about 615 nm and less than or equal to about 650 nm, less than or equal to about 645 nm, less than or equal to about 640 nm, less than or equal to about 635 nm, less than or equal to about 630 nm, less than or equal to about 625 nm, or less than or equal to about 620 nm). The first region may be disposed at a place overlapped with the section emitting green light and the second region may be disposed at a place overlapped with the section emitting red light. The first region and the second region may be optically isolated. The first optical filter (layer) may contribute to improving color purity of a display device.

The first optical filter layer may be a reflective filter including a plurality of layers (e.g., inorganic material layers) with different refractive index. For example two layers having different refractive index may be alternately stacked with each other, or for example a layer having a high refractive index and a layer having a low refractive index may be alternately stacked with each other As the difference of the refractive index is between the layer having a high refractive index and the layer having a low refractive index increases, the first optical filter layer thus formed may have a higher, e.g., greater, wavelength selectivity. A thickness and the stacked number of the layer having a high refractive index and the layer having a low refractive index may be determined according to a refractive index of each layer and a reflected wavelength, for example, each layer having a high refractive index may have a thickness of about 3 nm to about 300 nm, and each layer having a low refractive index may have a thickness of about 3 nm to about 300 nm.

A total thickness of the first optical filter layer may be, for example, about 3 nm to about 10,000 nm, about 300 nm to about 10,000 nm, or about 1,000 nm to about 10,000 nm. All layers having a high refractive index may have the same thickness and the same material or different from each other, and all layers having a low refractive index may have the same thickness and the same material or different from each other.

The display device may further include a second optical filter layer (e.g., red/green or yellow light recycling layer) disposed between the light emission layer and the liquid crystal layer (e.g., between light emission layer and upper polarizer) and transmitting at least a portion of the third light and reflecting at least a portion of the first light and the second light. The second optical filter layer may reflect light in a wavelength region of greater than about 500 nm. The first light may be red light, the second light may be green light, and the third light may be blue light.

In the display device according to an embodiment, the second optical filter layer may be formed as an integrated one layer having a relatively planar surface.

In an embodiment, the second optical filter layer may include a monolayer having a low refractive index, for example, the second optical filter layer may be a transparent thin film having a refractive index of less than or equal to about 1.4, less than or equal to about 1.3, or less than or equal to about 1.2.

The second optical filter layer having a low refractive index may be, for example, a porous silicon oxide, a porous organic material, a porous organic/inorganic composite, or a combination thereof.

In an embodiment, the second optical filter layer may include a plurality of layers having different refractive indexes, for example, the second optical filter layer may be formed by alternately stacking two layers having different refractive indexes, or for example, the second optical filter layer may be formed by alternately stacking a material having a high refractive index and a material having a low refractive index.

The layer having a high refractive index in the second optical filter layer may include, for example, hafnium oxide, tantalum oxide, titanium oxide, zirconium oxide, magnesium oxide, cesium oxide, lanthanum oxide, indium oxide, niobium oxide, aluminum oxide, silicon nitride, or a combination thereof. According to an embodiment, the layer having a high refractive index in the second optical filter layer may include a variety of materials having a higher refractive index than the layer having a low refractive index.

The layer having a low refractive index in the second optical filter layer may include, for example, a silicon oxide. According to an embodiment, the layer having a low refractive index in the second optical filter layer may include a variety of materials having a lower refractive index than the layer having a high refractive index.

As the refractive index difference between the layer having a high refractive index and the layer having a low refractive index increases, the second optical filter layer may have a higher, e.g., greater, wavelength selectivity.

In the second optical filter layer, each thickness of the layer having a high refractive index and the layer having a low refractive index and the stacked number thereof may be determined depending upon a refractive index of each layer and the reflected wavelength. For example, each layer having a high refractive index in the second optical filter layer may have a thickness of about 3 nm to about 300 nm, and each layer having a low refractive index in the second optical filter layer may have a thickness of about 3 nm to about 300 nm. A total thickness of the second optical filter layer may be, for example, from about 3 nm to about 10,000 nm, about 300 nm to about 10,000 nm, or about 1,000 nm to about 10,000 nm. Each of the layer having a high refractive index and the layer having a low refractive index in the second optical filter layer may have the same thickness and materials or different thickness and materials from each other.

The second optical filter layer may reflect at least a portion of the first light (R) and the second light (G) and transmits at least a portion (e.g., whole part) of the third light (B). For example, the second optical filter layer may transmit only the third light (B) in a blue light wavelength region of less than or equal to about 500 nm and light in a wavelength region of greater than about 500 nm, that is, green light (G), yellow light, red light (R), and the like may not pass through the second optical filter layer 311 and may not be reflected. Thus the reflected green light and red light may pass through the first and the second sections to be emitted to the outside of the display device.

The second optical filter layer may reflect a wavelength region of greater than about 500 nm in greater than or equal to about 70%, greater than or equal to about 80%, or greater than or equal to about 90%, or about 100%.

Meanwhile, the second optical filter layer may have a transmittance to light of a wavelength region of less than or equal to about 500 nm of, for example, greater than or equal to about 90%, greater than or equal to about 92%, greater than or equal to about 94%, greater than or equal to about 96%, greater than or equal to about 98%, greater than or equal to about 99%, or about 100%.

In an embodiment, the stack structure may be produced by a method using the photoresist composition. The method may include:

forming a film of the composition on a substrate;

exposing a selected region of the film to light (e.g., a wavelength of less than or equal to about 400 nm); and developing the exposed film with an alkali developing solution to obtain a pattern including the quantum dot-polymer composite.

Figure 5:
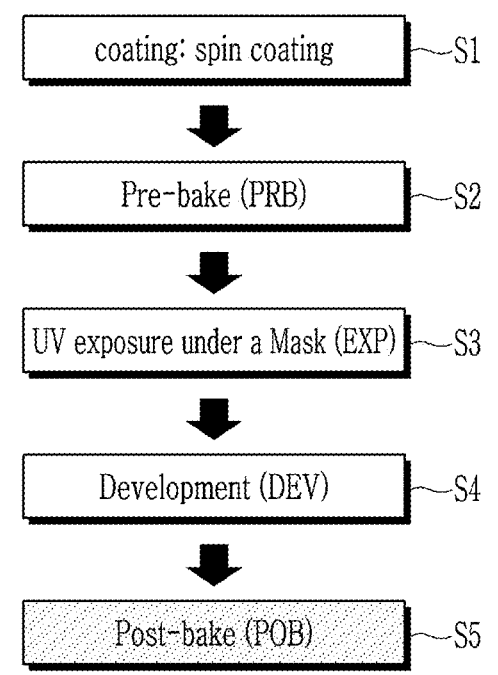
FIG. 5 is a schematic view showing a pattern forming process using a composition according to an embodiment.
Figure 5:
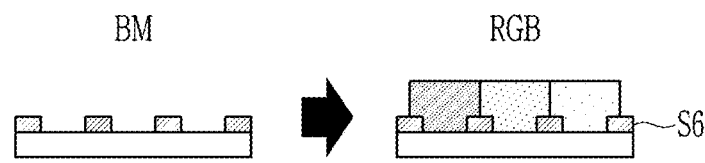

The substrate and the composition are the same as described above. Non-limiting methods of forming the pattern are illustrated, referring to FIG. 5.

The composition is coated to have a predetermined thickness on a substrate in an appropriate method of spin coating, slit coating, and the like (S1). The formed film may be, optionally, pre-baked (PRB) (S2). The pre-baking may be performed by selecting appropriate conditions of temperature, time, atmosphere, and the like.

The formed (or optionally pre-baked) film is exposed to light having a predetermined wavelength under a mask having a predetermined pattern (S3). A wavelength and intensity of the light may be selected by taking into consideration the initiator (e.g., photoinitiator), an amount of the initiator (e.g., photoinitiator), the quantum dots, amounts of the quantum dots, and the like.

The exposed film is treated with an alkali developing solution (e.g., dipping or spraying) to dissolve an unexposed region and obtain a desired pattern (S4). The obtained pattern may be, optionally, post-baked (FOB) to improve crack resistance and solvent resistance of the pattern, for example, at about 150° C. to about 230° C. for a predetermined time (e.g., greater than or equal to about 10 minutes or greater than or equal to about 20 minutes) (S5).

In an embodiment in which the quantum dot-polymer composite pattern has a plurality of repeating sections, a quantum dot-polymer composite having a desired pattern may be obtained by preparing a plurality of compositions including a quantum dot having desired photoluminescence properties (a photoluminescence peak wavelength and the like) to form each repeating section (e.g., a red light emitting quantum dot, a green light emitting quantum dot, or optionally, a blue light emitting quantum dot) and an appropriate number of times (e.g., two or more times or three or more times) repeating a formation of the above pattern about each composition (S6). For example, the quantum dot-polymer composite may have, e.g., be provided in, a pattern including at least two repeating color sections (e.g., RGB sections). The quantum dot-polymer composite pattern may be used as a photoluminescence-type color filter in a display device.

In an embodiment, the stack structure may be produced using an ink composition. The method may include depositing the same (e.g., to provide a desirable pattern) on the desirable substrate using an appropriate system (e.g., a droplet discharging device such as an inkjet or nozzle printing device) and heating the same to remove a solvent and to perform a polymerization. The method may provide a highly precise quantum dot-polymer composite film or pattern in a simple and rapid way.

An embodiment provides an electronic device including the quantum dot. The device may include a light emitting diode (LED), an organic light emitting diode (OLED), a sensor, a solar cell, an imaging sensor, or a liquid crystal display (LCD), but is not limited thereto.

Hereinafter, the embodiments are illustrated in more detail with reference to examples. However, they are exemplary embodiments of the present invention, and the present invention is not limited thereto.

EXAMPLES

Analysis Methods
1. Ultraviolet-Visible (UV-Vis) Spectroscopy
A UV spectroscopy is performed, and a UV-Visible absorption spectrum is obtained by using an Agilent Cary 5000 spectrometer.
2. Photoluminescence Analysis
A photoluminescence (PL) spectrum of a produced quantum dot at an excitation wavelength of 450 nanometers (nm) is obtained using a Hitachi F-7000 spectrometer.
3. Inductively Coupled Plasma-atomic Emission Spectroscopy (ICP-AES)
An inductively coupled plasma-atomic emission spectroscopy (ICP-AES) is performed using Shimadzu ICPS-8100.
4. X-Ray Photoelectron Spectroscopy (XPS)
An XPS element analysis is performed using Quantum 2000 made by Physical Electronics, Inc. under the conditions of an acceleration voltage: 0.5 to 15 kiloelectron volts (keV), 300 watts (W), and a minimum analysis area: 200× 200 square micrometers ($\mu m^2$).
5. Transmission Electron Microscopy Analysis
A transmission electron microscopic photograph of a produced nanocrystal is obtained by using an UT F30 Tecnai electron microscope.
6. Blue Light Absorption (Quantum Efficiency (QE)) of Composite Blue light absorption is measured using an integrating sphere and HAMAMATSU-Quantaurus-QY, C11347 (producer: Hamamatsu). The blue light absorption is obtained according to the following formulae.

Blue light absorption=$(B-B')/B \times 100\%$

B: Light dose of blue excitation light
B': Light dose of blue excitation light emitted from composite Example 1-1

1. Seed Synthesis:
Selenium is dispersed in trioctylphosphine (TOP) to obtain a Se/TOP stock solution. In a 300 milliliter (mL) reaction flask containing trioctylamine, an organic ligand including oleic acid is put and then, heated at 120° C. under vacuum. After about 1 hour, an atmosphere in the reactor is converted into inert gas. While the temperature of the reactor is increased up to 300° C., diethylzinc, diphenylphosphine oxide, and the Se/TOP stock solution are injected thereinto. After completing the injection, a reaction is performed for 40 minutes.

When the reaction is complete, acetone is added to the reaction solution, which is rapidly cooled down to room temperature, and a precipitate obtained by centrifuging the mixture is dispersed in toluene to obtain a ZnSe seed. The ZnSe seed has an average size of about 2.7 nm (a standard deviation: 0.43 nm).

A content ratio of a Zn precursor and an Se precursor used herein are adjusted into about 2:1.
2. Formation of Quantum Well Layer
Zinc stearate and indium palmitate and an organic ligand including oleic acid are put in a 300 mL reaction flask containing octadecene (ODE) and vacuum-treated at 120° C. The flask is internally substituted with nitrogen ($N_2$). While the temperature of the reactor is increased to 200° C., toluene dispersion of the ZnSe seed is rapidly put in the reaction flask, and subsequently, TOP dispersion of tris (trimethylsilyl)phosphine (hereinafter, also referred to as 'TMSP') is injected thereinto.

After completing the injection, a reaction is performed for predetermined time.

When the reaction is complete, the reaction solution is rapidly cooled down to room temperature and ethanol is added thereto, and a precipitate is separated by centrifuging and is dispersed in toluene to obtain nanoparticles having a ZnInP buffer layer. The obtained nano-particles have an average size of about 3.48 nm (a standard deviation: 0.35 nm).

A content ratio of a zinc precursor, an indium precursor, and a phosphorous precursor used herein are adjusted into about 5:1:4. A content ratio of this zinc precursor relative to the zinc precursor used in the seed (Zn buffer layer: Zn seed) is adjusted to be about 1:3.

An organic ligand including oleic acid is put in a 300 mL reaction flask containing octadecene (ODE) and vacuum-treated at 120° C. The flask is internally substituted with nitrogen ($N_2$). While the reaction temperature of the reactor is increased to 260° C., the toluene dispersion of the nanoparticles having a ZnInP buffer layer is rapidly put in the reaction flask, and subsequently, an octadecene solution of indium palmitate is injected thereinto, and then, an octadecene solution of tris(trimethylsilyl)phosphine (hereinafter, also referred to as 'TMSP') is injected thereinto.

When the injection is complete, a reaction is performed for predetermined time to form a quantum well layer on the seed.

When the reaction is complete, ethanol is added to the reaction solution, which is rapidly cooled down to room temperature, and a precipitate obtained by centrifuging the mixture is dispersed in toluene to obtain nanoparticles having a quantum well layer on the seed. The obtained nanoparticles have an average size of about 3.56 nm (a standard deviation: 0.34 nm).

A content ratio of an indium precursor and a phosphorous precursor used herein are adjusted into 1:1. A ratio of indium used to form the quantum well (QW) layer relative to indium used to form the buffer layer (an In buffer layer: In QW) is about 8:1.

3. Formation of Shell layer

Zinc acetate and oleic acid are placed in a 300 mL reaction flask containing TOA and then, vacuum-treated at 120° C. The flask is internally substituted with nitrogen ($N_2$). While the reaction temperature of the reactor is increased to 320° C., toluene dispersion of the particles having the quantum well layer and the Se/TOP stock solution are injected into the reaction flask, respectively, and subsequently, a S/TOP stock solution is injected thereinto.

When the injection is complete, a reaction is performed for predetermined time, and a ZnSeS shell layer is formed on the quantum well layer.

When the reaction is complete, ethanol is added to the reaction solution, which is rapidly cooled down to room temperature, and a precipitate obtained by centrifuging the mixture is dispersed in toluene to obtain toluene dispersion of quantum dots having a ZnSe/quantum well/a ZnSeS shell structure. The obtained quantum dots have an average size of about 6.94 nm (a standard deviation: 0.45 nm).

A content ratio (Zn:Se:S) of a Zn precursor, an Se precursor, and an S precursor used herein is about 3.4:1:4, and a content ratio of the Zn precursor in the seed:the Zn precursor in the shell is about 1:2.7.

4. Analysis

Figure 6:
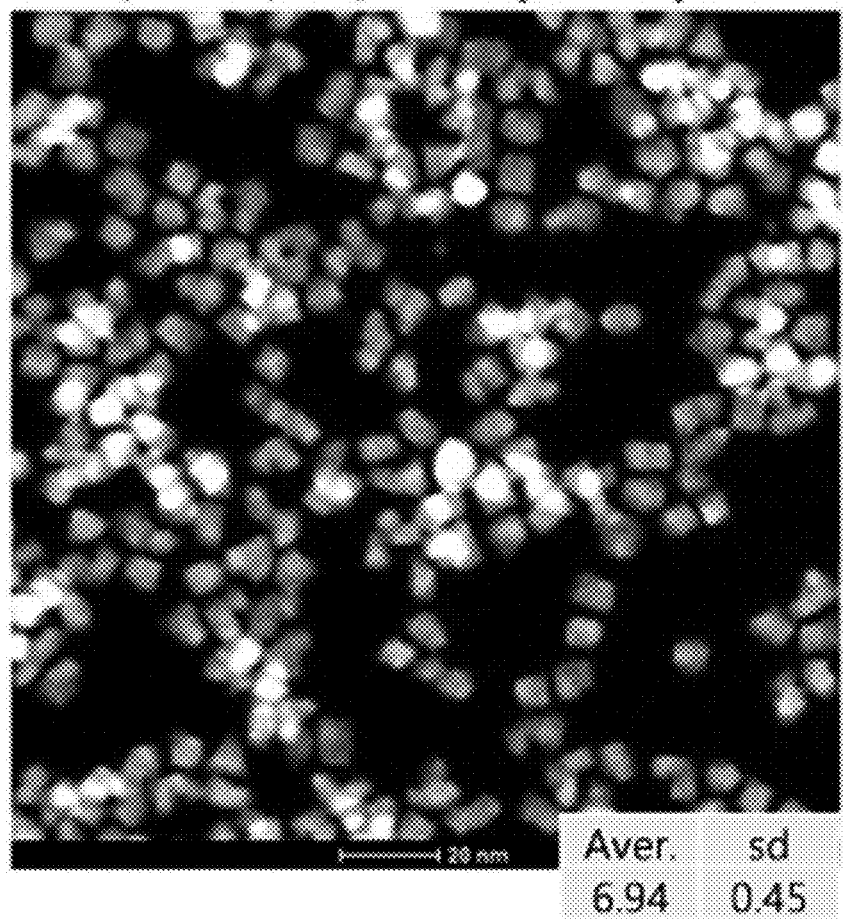
FIG. 6 shows the result of transmission electron microscope analysis for the quantum dot prepared in Example 1-1.

A transmission electron microscope (TEM) analysis with respect to the prepared particles and quantum dots is performed. A TEM image of the quantum dots is shown in FIG. 6. In the TEM analysis of the particles, ZnSe has a spherical shape and an average particle size of 2.7 nm but after synthesizing a buffer layer, an average particle size of 3.48 nm and after synthesizing a quantum well layer, an average particle size of 3.56 nm, and accordingly, the nanoparticles initially have the same spherical shape as that of ZnSe, but final quantum dots mostly have a non-spherical shape. The final quantum dots have an average size (Aver.) of 6.94 nm under a standard deviation (sd) of 0.45 nm.

A transmission electron microscope-energy dispersive X-ray (EDX) spectroscopy mapping is performed in each step to confirm that the prepared quantum dots have the above structure of a ZnSe seed/(QW including ZnInP as a buffer layer and InP)/a ZnSeS shell.

Inductively coupled plasma-atomic emission spectroscopy is performed with respect to nanoparticles in each synthesis step and quantum dots, and the results are shown in Tables 1 and 2.

TABLE 1

| Sample | mole ratio relative to Se | | |
|---|---|---|---|
| | P/Se | Zn/Se | In/Se |
| ZnSe seed | — | 1.29 | — |
| After forming a ZnInP buffer layer | 0.11 | 1.42 | 0.01 |
| After forming a quantum well | 0.28 | 1.27 | 0.19 |

Referring to the results of Table 1, when the ZnSe seed is synthesized, and ZnInP is coated thereon, ratios of Zn, In, and P are increased, but when an InP layer is formed, a Zn element is decreased. Without being bound by any particular theory, it is believed that that the ZnInP layer may function as a buffer layer. Without being bound by any particular theory, at least a portion of zinc is regarded to be substituted or exchanged with In. An XPS analysis is performed to analyze a bonding state of elements in each step. As a result, a ZnInP bond after the ZnInP coating is confirmed, and after the synthesis of the quantum well layer, an InP bond becomes further clear, but strength of the ZnInP bond becomes weak.

Figure 7:
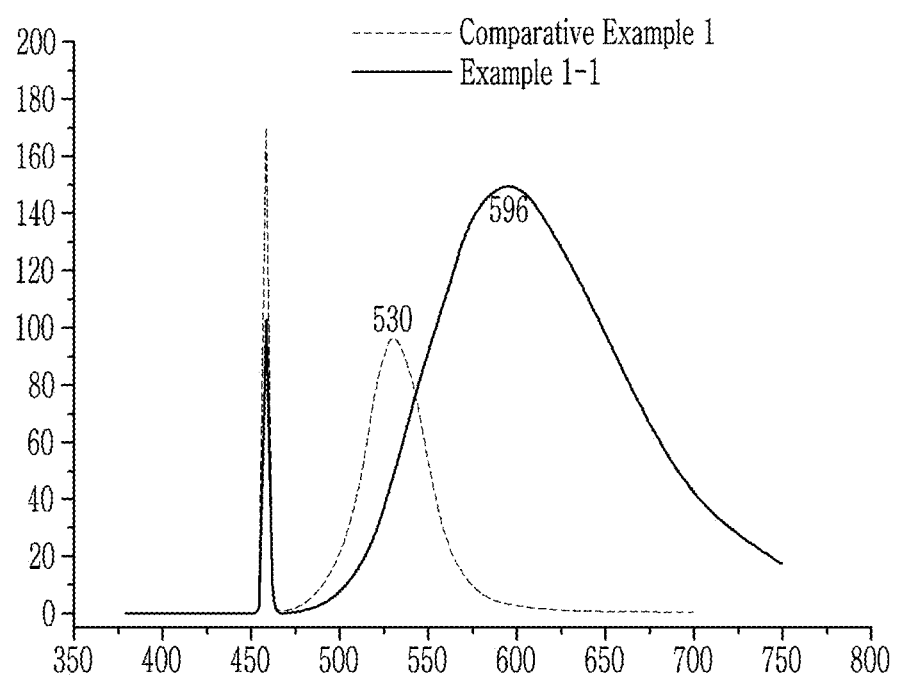
FIG. 7 is a graph of Photoluminescence (arbitrary units (a.u.)) versus Wavelength (nanometers (nm)) showing the results of photoluminescence analyses of the quantum dots prepared in Example 1-1 and Comparative Example

5. A photoluminescence characteristic analysis of the quantum dots is performed, and the results are shown in FIG. 7.

Example 1-2

1. Quantum dots having a ZnSe/quantum well/ZnSeS shell structure are synthesized according to the same method as Example 1-1 except that the Se injection amount is reduced to 1/10 during the final ZnSeS shell coating, and optical density (OD) of the particles having the quantum well layer is reduced to 3/5. The obtained quantum dots have an average size of about 6.45 nm (a standard deviation: 0.42 nm).

2. Analysis

The inductively coupled plasma-atomic emission spectroscopy of the final quantum dots is performed and the results are shown in Table 2.

Example 1-3

1. Quantum dots having a ZnSe/quantum well/ZnSeS shell structure are synthesized according to the same method as Example 1-1 except that the Se injection amount is reduced to about 1/9 during the final ZnSeS shell coating. The obtained quantum dots have an average size of about 5.79 nm (a standard deviation: 0.55 nm).

2. Analysis

The inductively coupled plasma-atomic emission spectroscopy of the final quantum dots is performed and the results are shown in Table 2.

TABLE 2

| | molar ratio | | | | | |
|---|---|---|---|---|---|---|
| | P/In and P/Se | S/Se | Zn/In and Zn/Se | Se/In | In/Se | Zn/(S + Se) |
| Example 1-2 | 1.21 and 0.25 | 5.50 | 37.64 and 7.75 | 4.86 | 0.21 | 1.19 |
| Example 1-3 | 1.54 and 0.27 | 4.93 | 40.15 and 6.96 | 5.77 | 0.17 | 1.173 |
| Example 1-1 | 1.14 and 0.02 | 0.28 | 75.14 and 1.46 | 51.43 | 0.02 | 1.14 |

Comparative Example 1

1. Quantum dots having a ZnSe seed/InP quantum well layer/ZnSeS shell structure are synthesized according to the same method as Example 1 except that the buffer layer is not formed.

The obtained quantum dots have an average size of about 8 nm and a large standard deviation compared with the quantum dots according to Example 1-1. When the buffer layer is not formed, the InP-based emission layer (i.e., a QW layer) is not uniformly formed, and accordingly, the finally obtained quantum dots have nonuniform morphology.

Figure 8:
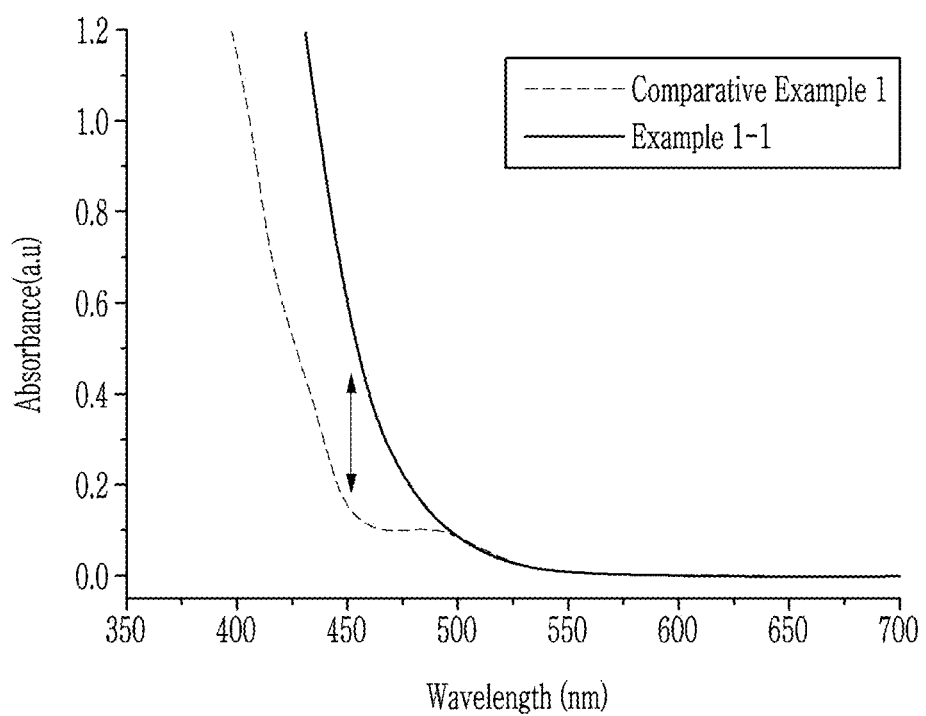
FIG. 8 is a graph of Absorbance (a.u.) versus Wavelength (nm) showing the result of UV-Vis spectroscopy of the quantum dots prepared in Example 1-1 and Comparative Example 1.

2. Analysis:

A transmission electron microscope analysis, a photoluminescence characteristic analysis, and UV-Vis absorption spectroscopy are performed with respect to the prepared quantum dots, and the results are shown in FIGS. 7 and 8.

Referring to the UV-Vis absorption spectroscopy, the quantum dots according to Example 1-1 show, e.g., exhibit, 4 times greater absorption about, e.g., of, light at a wavelength of 450 nm compared with the quantum dots according to Comparative Example 1.

Example 2

Quantum dots having a ZnTeSe seed/quantum well/ZnSeS shell structure are synthesized according to the same method as Example 1-1 except that a Te/TOP stock solution and the Se/TOP stock solution are used during formation of the seed, and indium is not used during formation of the buffer layer.

Example 3

Quantum dots having a ZnS seed/quantum well/ZnSeS shell structure are synthesized according to the same method as Example 1-1 except that an S/TOP stock solution is used instead of the Se/TOP stock solution during formation of the seed.

Example 4

Quantum dots having a ZnSe/quantum well/ZnSeS shell structure are synthesized according to the same method as Example 1 except that a quantum well layer is formed by using an aluminum phosphorus oxide-based buffer layer formed in the following method:

An organic ligand including oleic acid is put in a 300 mL reaction flask containing octadecene (ODE) and then, vacuum-treated at 120° C. The flask is internally substituted with nitrogen ($N_2$). While the reaction temperature of the reactor is increased to 200° C., toluene dispersion of the prepared ZnSe seed is rapidly put in the reaction flask, and subsequently, TOP dispersion of aluminum isopropoxide and tris(trimethylsilyl)phosphine (hereinafter, also referred to as 'TMSP') is injected thereinto. The aluminum isopropoxide and TMSP are used in a mole ratio of about 1:0.7.

When the injection is complete, a reaction is performed for predetermined time.

When the reaction is complete, ethanol is added to the reaction solution, which is rapidly cooled down to room temperature, and a precipitate obtained by centrifuging the mixture is dispersed in toluene to obtain nanoparticles having an $Al_xPO_y$ buffer layer.

Experimental Example 1: Preparation of Quantum Dot Polymer Composite and Production of Pattern Thereof (1) Preparation of Quantum Dot-Binder Dispersion Each quantum dot chloroform dispersion according to Example 1-1 or Comparative Example 1 is mixed with a binder (a quaternary copolymer of methacrylic acid, benzyl methacrylate, (hydroxyethyl)methacrylate, and styrene, acid value: 130 milligrams of potassium hydroxide per gram (mg KOH/g), molecular weight: 8,000, methacrylic acid:benzyl methacrylate:(hydroxyethyl)methacrylate:styrene (mole ratio): 61.5:12:16.3:10.2) solution (polypropylene glycol monomethyl ether acetate (PGMEA) having a concentration of 30 weight percent (wt %)) to prepare quantum dot-binder dispersion.

(2) Preparation of Photosensitive Composition

The quantum dot binder dispersion is mixed with hexaacrylate having the following structure as a photopolymerizable monomer, glycoldi-3-mercaptopropionate as a multiple thiol compound (hereinafter, 2T), an oxime ester compound as an initiator, and $TiO_2$ as a light diffusing agent and PGMEA to prepare a composition.

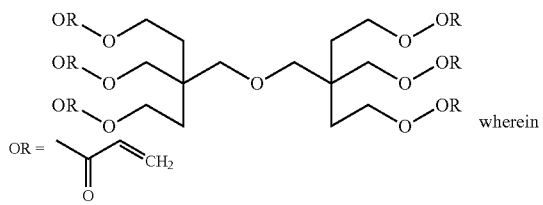

The prepared composition includes 40 wt % of the quantum dot, 12.5 wt % of the binder polymer, 25 wt % of 2T, 12 wt % of the photopolymerizable monomer, 0.5 wt % of the initiator, and 10 wt % of the light diffusing agent based on a solid content of the composition, and a total solid content is 25%.

(3) Production of Quantum Dot-Polymer Composite Pattern and Heat Treatment

Each photosensitive composition is spin-coated on a glass substrate at 150 revolutions per minute (rpm) for 5 seconds to obtain films. The films are pre-baked (PRB) at 100° C. These pre-baked films are exposed to irradiation of light (a wavelength: 365 nm, intensity: 100 millijoules (mJ)) for 1 second under a mask having a predetermined pattern (e.g., a square dot or a stripe pattern), developed in a potassium hydroxide aqueous solution (a concentration: 0.043%) for 50 seconds to obtain quantum dot-polymer composite patterns (a thickness: about 6 μm).

The obtained quantum dot-polymer composite pattern is FOB heat-treated for 30 minutes under a nitrogen atmosphere.

Blue light absorptions of the obtained patterned films are measured and the results are shown in Table 3.

TABLE 3

|  | Film including quantum dot of Example 1-1 | Film including quantum dot of Comparative Example 1-1 |
|---|---|---|
| Blue light absorption | 93.8% | 82.9% |

Referring to the results of Table 3, the film including the quantum dot according to Example 1-1 exhibits improved blue light absorption compared with the film including the quantum dot according to Comparative Example 1-1.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A quantum dot comprising
a seed comprising a first semiconductor nanocrystal comprising a first Group II-VI compound,
a quantum well surrounding the seed, the quantum well comprising a second semiconductor nanocrystal comprising a Group IIIA metal and a Group V element, wherein the Group IIIA metal does not comprise aluminum, and
a shell disposed on the quantum well, the shell comprising a third semiconductor nanocrystal comprising a second Group II-VI compound,
wherein the quantum dot does not comprise cadmium,
wherein an energy bandgap of the second semiconductor nanocrystal is smaller than an energy bandgap of the first semiconductor nanocrystal, and
an energy bandgap of the second semiconductor nanocrystal is smaller than an energy bandgap of the third semiconductor nanocrystal, and
wherein an ultraviolet-visible absorption spectrum curve of the quantum dot does not have an inflection point within a wavelength range of about 450 nanometers to about 600 nanometers.

2. The quantum dot of claim 1, wherein the first Group II-VI compound, the second Group II-VI compound, or a combination thereof comprises zinc chalcogenide.

3. The quantum dot of claim 1, wherein the first semiconductor nanocrystal and the third semiconductor nanocrystal have different compositions from one another.

4. The quantum dot of claim 1, wherein
the first semiconductor nanocrystal comprises ZnSe, ZnTeSe, ZnSeS, ZnS, or a combination thereof, and
the third semiconductor nanocrystal comprises ZnSe, ZnSeS, ZnS, or a combination thereof.

5. The quantum dot of claim 1, wherein the quantum well comprises indium and phosphorus.

6. The quantum dot of claim 1, wherein
the quantum dot emits green light, and
an ultraviolet-visible absorption spectrum curve of the quantum dot does not have an inflection point within a wavelength range of about 450 nanometers to about 580 nanometers.

7. The quantum dot of claim 1, wherein
the quantum dot emits green light, and
in an ultraviolet-visible absorption spectrum curve of the quantum dot, a ratio of an intensity at a wavelength of 450 nanometers relative to an intensity at a wavelength of 500 nanometers is greater than or equal to about 2.0:1.

8. The quantum dot of claim 1, wherein
the quantum dot emits red light, and
an ultraviolet-visible absorption spectrum curve of the quantum dot does not have an inflection point within a wavelength range of about 550 nanometers to about 620 nanometers.

9. A method of producing the quantum dot of claim 1, comprising
obtaining the seed;
forming a buffer layer on the seed, the buffer layer comprising a zinc-containing Group II-V compound, a zinc-containing Group II-III-V compound, an aluminum phosphorus oxide, or a combination thereof;
forming the quantum well on the buffer layer; and
forming the shell on the quantum well.

10. A composition comprising
the quantum dots of claim 1,
a dispersing agent,
a polymerizable monomer comprising a carbon-carbon unsaturated bond,
an initiator, and
a solvent.

11. A patterned film comprising
a repeating section configured to emit light in a predetermined wavelength range,
wherein the repeating section comprises a quantum dot polymer composite, and
the quantum dot-polymer composite comprises a polymer matrix; and the quantum dot of claim 1 is in the polymer matrix.

12. The quantum dot of claim 5, wherein the quantum well further comprises zinc, aluminum, or a combination thereof.

13. The quantum dot of claim 5, wherein the quantum well further comprises aluminum and oxygen.

14. The quantum dot of claim 5, wherein in the quantum dot, a total molar amount of indium and phosphorus is less than or equal to about 20%.

15. The quantum dot of claim 5, wherein the quantum dot has a ratio of phosphorus relative to indium of greater than or equal to about 1:1.

16. The quantum dot of claim 12, wherein the quantum dot has a ratio of zinc relative to indium of greater than or equal to about 20:1.

17. The quantum dot of claim 12, wherein
the seed comprises zinc and selenium and the shell comprises zinc, selenium, and sulfur, and
the quantum dot has a mole ratio of zinc relative to a sum of the selenium and sulfur of greater than or equal to about 1:1.

18. The quantum dot of claim 12, wherein the quantum well comprises a plurality of layers and adjacent layers of the plurality of layers have different compositions from one another.

19. The quantum dot of claim 18, wherein a layer of the quantum well adjacent to the seed comprises zinc phosphide, zinc indium phosphide, aluminum-phosphorus-oxide, or a combination thereof.

20. The quantum dot of claim 18, wherein a layer of the quantum well adjacent to the shell comprises indium phosphide.

21. The method of claim 9, further comprising separating the seed from a reaction medium before forming the buffer layer.

22. The method of claim 9, further comprising separating the seed from a reaction medium after forming the buffer layer and before forming the quantum well.

23. The composition of claim 10, wherein
the dispersing agent is a polymer comprising a carboxylic acid group,
wherein the polymer comprises
a copolymer of a monomer combination comprising a first monomer comprising a carboxylic acid group and a carbon-carbon double bond, a second monomer comprising a carbon-carbon double bond and a hydrophobic moiety and not comprising a carboxylic acid group, and optionally a third monomer comprising a carbon-carbon double bond and a hydrophilic moiety and not comprising a carboxylic acid group;

a multiple aromatic ring-containing polymer having a backbone structure in which two aromatic rings are bound to a quaternary carbon atom that is a constituent atom of another cyclic moiety in a main chain of the backbone structure, the multiple aromatic ring-containing polymer comprising a carboxylic acid group (—COOH); or a combination thereof.

24. The composition of claim 10, wherein the composition further comprises a multiple thiol compound comprising at least two thiol groups at a terminal end of the multiple thiol compound, a metal oxide particulate, or a combination thereof.

25. The patterned film of claim 11, wherein the polymer matrix comprises a dispersing agent, a polymerization product of a polymerizable monomer comprising a carbon-carbon double bond, and optionally a polymerization product of the polymerizable monomer and a multiple thiol compound comprising at least two thiol groups at a terminal end of the multiple thiol compound.

26. The patterned film of claim 11, wherein the repeating section comprises a first section configured to emit red light, a second section configured to emit green light, or a combination thereof.

27. A display device comprising
a light source and a photoluminescence element,
wherein the photoluminescence element comprises a substrate and the patterned film of claim 11 is disposed on a surface of the substrate, and
the light source is configured to provide the photoluminescence element with incident light.

28. The display device of claim 27, wherein the incident light has a photoluminescence peak wavelength in a range of about 440 nanometers to about 460 nanometers.

* * * * *